United States Patent
Maeda et al.

(10) Patent No.: US 7,652,508 B2
(45) Date of Patent: Jan. 26, 2010

(54) CIRCUIT DEVICE AND ELECTRONIC EQUIPMENT PROVIDED WITH THE SAME

(75) Inventors: Kazuhiro Maeda, Kizugawa (JP); Hiroshi Murofushi, Tokyo (JP); Nobuhiko Suzuki, Tokyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 179 days.

(21) Appl. No.: 11/918,875

(22) PCT Filed: Apr. 20, 2006

(86) PCT No.: PCT/JP2006/308331

§ 371 (c)(1),
(2), (4) Date: Oct. 19, 2007

(87) PCT Pub. No.: WO2006/112504

PCT Pub. Date: Oct. 26, 2006

(65) Prior Publication Data

US 2009/0051392 A1 Feb. 26, 2009

(30) Foreign Application Priority Data

Apr. 20, 2005 (JP) .............................. 2005-122881

(51) Int. Cl.
*H03K 5/153* (2006.01)
(52) U.S. Cl. .............................. 327/72; 327/73; 327/78
(58) Field of Classification Search ........................ None
See application file for complete search history.

(56) References Cited

U.S. PATENT DOCUMENTS

| 4,574,206 | A | | 3/1986 | Todokoro et al. | ............. 327/68 |
| 5,376,834 | A | * | 12/1994 | Carobolante | ................ 327/143 |
| 6,335,641 | B1 | * | 1/2002 | Tougou | ........................ 327/73 |
| 6,417,700 | B1 | * | 7/2002 | Hirata et al. | ................... 327/72 |
| 6,828,828 | B2 | * | 12/2004 | Marshall et al. | ................ 327/68 |
| 2007/0211013 | A1 | * | 9/2007 | Uehara et al. | ............... 345/102 |

FOREIGN PATENT DOCUMENTS

| EP | 0 663 597 | 7/1995 |
| JP | 57-053809 | 3/1982 |

(Continued)

*Primary Examiner*—An T Luu
(74) *Attorney, Agent, or Firm*—Harness, Dickey & Pierce, P.L.C.

(57) ABSTRACT

In one embodiment, a circuit device that performs a certain processing operation with respect to an input signal by referring to a reference voltage and outputs the result is caused to have a function of switching the reference voltage, whereby a circuit device from which a stable output can be obtained is disclosed. The circuit device includes a comparator and a reference voltage setting circuit. The comparator compares an input voltage fed from outside with a reference voltage selected from a reference voltage set including a plurality of voltage values that are different from one another. The reference voltage setting circuit selects a voltage value lower than the reference voltage from the reference voltage set when it is detected that the input voltage in a rising transition reaches the reference voltage, selects a voltage value higher than the reference voltage from the reference voltage set when it is detected that the input voltage in a falling transition reaches the reference voltage, and sets the selected voltage value as the reference voltage of the comparator.

18 Claims, 25 Drawing Sheets

FOREIGN PATENT DOCUMENTS

| | | |
|---|---|---|
| JP | 58-017720 | 2/1983 |
| JP | 61-110177 | 5/1986 |
| JP | 61-110177 | 7/1986 |
| JP | 4-147086 | 5/1992 |
| JP | 07-221613 | 8/1995 |
| JP | 7-221613 | 8/1995 |

* cited by examiner

CIRCUIT DEVICE AND ELECTRONIC EQUIPMENT PROVIDED WITH THE SAME

TECHNICAL FIELD

The present invention relates to a circuit device, for example, a sensor circuit or a level shifter circuit, which performs a certain processing operation with respect to an input signal by referring to a reference voltage and outputs the result. The present invention particularly relates to a circuit device that has a function of switching the reference voltage to one of a plurality of levels, and to electronic equipment provided with the circuit device.

BACKGROUND ART

Conventionally, a circuit device, for example, a sensor circuit or a level shifter circuit, which performs a certain processing operation with respect to an input signal by referring to a reference voltage and outputs the result, has been used widely.

FIG. 34 is a block diagram showing a configuration of a conventional common sensor circuit. There are various types of conventional sensor circuits depending on detection objects, but generally a sensor circuit is composed of, mainly, a sensor section 90 and a comparator 80, as shown in FIG. 34. The sensor section 90 has a sensor element 91 that receives a sensor input g1 (light, temperature, pressure, etc.) corresponding to a detection object of the sensor circuit and feeds out a current or a voltage corresponding to the intensity of the sensor input g1. The current or the voltage fed out of the sensor element 91 is sampled and charged in a capacitor 92 for a certain period, and a sensor output g2 corresponding to the intensity of the sensor input g1 can be obtained. The sensor output g2 is fed to the comparator 80. In the comparator 80, the sensor output 2g is compared with a reference voltage $V_{ref}$, whereby an intensity or the like of the sensor input g1 is determined.

In the foregoing sensor section 90, a switching control operation is carried out between switches 93 and 94 from one to the other appropriately, whereby the sensor output g2 as shown in FIG. 35 can be obtained. In the case of the sensor output g2 as shown in FIG. 35, the presence/absence of the sensor input g1 can be determined by comparing a peak potential during a sampling period with the reference voltage $V_{ref}$ as shown in FIG. 36. As shown in FIG. 37, the reference voltage $V_{ref}$ may be set at a plurality of levels ($V_{ref1}$ to $V_{ref3}$ in this example) and the peak potential is compared with values of at the plurality of levels of the reference voltage sequentially, whereby the intensity or the like of the sensor input g1 can be determined also.

As shown in FIG. 38, a photo sensor has been proposed conventionally that improves accuracy of light reception by performing time-division switching control for switching a reference voltage fed to a comparator between a first reference voltage ($V_{ref1}$) at a detection level and a second reference voltage ($V_{ref2}$) at an excess level (see, e.g., JP 4 (1992)-147086 A (page 3, FIG. 2 thereof)).

DISCLOSURE OF INVENTION

Problem to be Solved by the Invention

The above-described conventional sensor circuits, however, have a problem that the output of the comparator 80 is not stable when the sensor output g2 is close to the reference voltage $V_{ref}$. For example, assume that in the case where the comparator 80 is configured to feed out a higher level output (a higher-level output is hereinafter referred to as "HIGH") when the peak potential of the sensor output g2 during a sampling period is greater than the reference voltage $V_{ref}$, and to feed out a lower-level output (a lower-level output is hereinafter referred to "LOW") when the foregoing peak potential is smaller than the reference voltage $V_{ref}$, the sensor output g2 is at substantially the same potential as that of the reference voltage $V_{ref}$ while making a transition with slight changes as shown in FIG. 39. In this case, as clear from the foregoing drawing, the output $C_{out}$ of the comparator 80 frequently switches between HIGH and LOW.

Therefore, there has been the following problem: when, for example, the potential of the sensor output g2 drifts due to influences of noises or the like from the inside of the sensor section 90 or circuits around the sensor section 90, the output $C_{out}$ of the comparator 80 is made unstable although fluctuations of the sensor output g2 are not significantly great, thereby resulting in that the output of the sensor circuit cannot be stabilized. It should be noted that such a problem occurs with, not exclusively to a sensor circuit, but commonly to circuit devices that perform a certain processing operation with respect to an input signal by referring to a reference voltage and outputs the result.

Further, the aforementioned photo sensor of JP 4 (1992)-147086 A also uses one of two reference voltage levels by switching so as to detect different levels of the detection level and the excess level, and does not take hysteresis control into consideration. Therefore, when the sensor output fluctuates in the vicinity of the reference voltage at the detection level or in the vicinity of the reference voltage at the excess level, the same problem as that described above occurs.

In light of the above-described problem, it is an object of the present invention to provide a circuit device from which a stable output can be obtained; the circuit device is obtained by imparting a function of switching a reference voltage to the circuit device that performs a certain processing operation with respect to an input signal by referring to a reference voltage and outputs the result.

Means for Solving Problem

In order to achieve the above-described object, the circuit device according to the present invention is a circuit device including a comparator that compares an input voltage fed from outside with a reference voltage selected from a reference voltage set including a plurality of voltage values that are different from one another. The circuit device further includes a reference voltage setting circuit that selects a voltage value lower than the reference voltage from the reference voltage set when it is detected that the input voltage in a rising transition reaches the reference voltage, selects a voltage value higher than the reference voltage from the reference voltage set when it is detected that the input voltage in a falling transition reaches the reference voltage, and sets the selected voltage value as the reference voltage of the comparator.

With this configuration, a voltage value lower than the reference voltage is selected from the reference voltage set when it is detected that the input voltage in a rising transition reaches the reference voltage, whereas a voltage value higher than the reference voltage is selected from the reference voltage set when it is detected that the input voltage in a falling transition reaches the reference voltage, and the selected voltage value is set as the reference voltage of the comparator. By so doing, even if the input voltage fluctuates in the vicinity of the initial reference voltage due to influences of noises or the like, the fluctuations of the input voltage hardly affects the output of the comparator. Accordingly, it is possible to provide a circuit device free from influences of noises or the like, from which a stable output can be obtained.

The above-described circuit device preferably further includes an S/N ratio determining circuit for determining an S/N ratio of the input voltage. In the circuit device, the reference voltage setting circuit sets one predetermined reference voltage value included in the reference voltage set as an initial value of the reference voltage of the comparator; and when it is detected that the input voltage in a rising transition reaches the reference voltage, the reference voltage setting circuit selects a voltage value in accordance with the S/N ratio determined by the S/N ratio determining circuit, from voltage values in the reference voltage set that are lower than the reference voltage, and sets the selected voltage value as the reference voltage of the comparator.

In this configuration, it is further preferable that a voltage value is set in accordance with the level of the S/N ratio; for example, in the case where the S/N ratio is relatively great, a voltage value relatively close to the above-described predetermined reference voltage value is set as the reference voltage, and as the S/N ratio decreases, a voltage value farther from the above-described predetermined reference voltage value is set as the reference voltage. By so doing, when the S/N ratio is relatively great, the comparing operation is carried out with the reference voltage close to the above-described predetermined reference voltage value, whereby the precision of the comparison result can be maintained at a high level. As the S/N ratio decreases (in other words, as the influences of noises increase), the comparing operation is carried out with the reference voltage farther from the above-described predetermined reference voltage value, whereby the influences of nooses on the comparison result can be suppressed.

The above-described circuit device preferably further includes an S/N ratio determining circuit for determining an S/N ratio of the input voltage. In this circuit device, the reference voltage setting circuit sets one predetermined reference voltage value in the reference voltage set as an initial value of the reference voltage of the comparator; and when it is detected that the input voltage in a falling transition reaches the reference voltage, the reference voltage setting circuit selects a voltage value in accordance with the S/N ratio determined by the S/N ratio determining circuit, from voltage values in the reference voltage set that are higher than the reference voltage, and sets the selected voltage value as the reference voltage of the comparator.

In this configuration, it is further preferable that a voltage value is set in accordance with the level of the S/N ratio; for example, in the case where the S/N ratio is relatively great, a voltage value relatively dose to the above-described predetermined reference voltage value is set as the reference voltage, and as the S/N ratio decreases, a voltage value farther from the above-described predetermined reference voltage value is set as the reference voltage. By so doing, when the S/N ratio is relatively great, the comparing operation is carried out with the reference voltage close to the above-described predetermined reference voltage value, whereby the precision of the comparison result can be maintained at a high level. As the S/N ratio decreases (in other words, as the influences of noises increase), the comparing operation is carried out with the reference voltage farther from the above-described predetermined reference voltage value, whereby the influences of noises on the comparison result can be suppressed.

The above-described circuit device preferably further includes a selection signal generating circuit for receiving a reference voltage designation input that designates one reference voltage value in the reference voltage set, and generating a selection signal for the reference voltage. In this circuit device, the reference voltage setting circuit selects a pair of reference voltage values in the reference voltage set according to the selection signal fed from the selection signal generating circuit; and when it is detected that the input voltage in a rising transition reaches the higher one of the pair of the reference voltage values, the reference voltage setting circuit sets the lower one of the pair of the reference voltage values as the reference voltage of the comparator, whereas when it is detected that the input voltage in a falling transition reaches the lower one of the pair of the reference voltage values, the reference voltage setting circuit sets the higher one of the pair of the reference voltage values as the reference voltage of the comparator.

With this configuration, a pair of reference voltages can be selected arbitrarily from the reference voltage set by making a reference voltage designation input according to the characteristics of the circuit device and the circumstances of the use thereof.

The above-described circuit device preferably further includes a selection signal generating circuit for receiving a reference voltage designation input that designates one reference voltage value in the reference voltage set, and generating a selection signal for the reference voltage, and an S/N ratio determining circuit for determining an S/N ratio of the input voltage. In this circuit device, the reference voltage setting circuit selects one reference voltage value in the reference voltage set according to the selection signal fed from the selection signal generation circuit, and sets the selected value as an initial value of the reference voltage of the comparator; and when it is detected that the input voltage in a rising transition reaches the reference voltage, the reference voltage setting circuit selects a voltage value in accordance with the S/N ratio determined by the S/N ratio determining circuit, from voltage values in the reference voltage set that are lower than the initial value of the reference voltage, and sets the selected voltage value as the reference voltage of the comparator.

With this configuration, an initial value of the reference voltage of the comparator can be selected arbitrarily by making a reference voltage designation input according to the characteristics of the circuit device and the circumstances of the use thereof. Besides, when the reference voltage is switched from an initial value to another value, the reference voltage can be set according to the level of the S/N ratio. By so doing, when the S/N ratio is relatively great, the comparing operation is carried out with the reference voltage close to the predetermined reference voltage value, whereby the precision of the comparison result can be maintained at a high level. As the S/N ratio decreases On other words, as the influences of noises increase), the comparing operation is carried out with the reference voltage farther from the above-described predetermined reference voltage value, whereby the influences of noises on the comparison result can be suppressed.

The above-described circuit device preferably further includes: a selection signal generating circuit for receiving a reference voltage designation input that designates one reference voltage value in the reference voltage set, and generating a selection signal for the reference voltage; and an S/N ratio determining circuit for determining an S/N ratio of the input voltage. In this circuit device, the reference voltage setting circuit selects one reference voltage value in the reference voltage set according to the selection signal fed from the selection signal generation circuit, and sets the selected value as an initial value of the reference voltage of the comparator;

and when it is detected that the input voltage in a falling transition reaches the reference voltage, the reference voltage setting circuit selects a voltage value in accordance with the S/N ratio determined by the S/N ratio determining circuit, from voltage values in the reference voltage set that are higher than the initial value of the reference voltage, and sets the selected voltage value as the reference voltage of the comparator.

With this configuration, the initial value of the reference voltage of the comparator can be selected arbitrarily by making a reference voltage designation input according to the characteristics of the circuit device and the circumstances of the use thereof. Besides, when the reference voltage is switched from an initial value to another value, the reference voltage can be set according to the level of the S/N ratio. By so doing, when the S/N ratio is relatively great, the comparing operation is carried out with the reference voltage close to the predetermined reference voltage value, whereby the precision of the comparison result can be maintained at a high level. As the S/N ratio decreases (in other words, as the influences of noises increase), the comparing operation is carried out with the reference voltage farther from the above-described predetermined reference voltage value, whereby the influences of noises on the comparison result can be suppressed.

The above-described circuit device preferably includes a plurality of sets of the comparator and the reference voltage setting circuit, wherein voltage values in a reference voltage set of each reference voltage setting circuit are set so that voltage values for one reference voltage setting circuit do not to overlap voltage values for another reference voltage setting circuit. With this configuration, the magnitude of the input voltage and the like can be determined to be one of a plurality of degrees.

The above-described circuit device preferably further includes a latch circuit on a stage following the comparator. In this circuit device, the reference voltage setting circuit selects a voltage value to be set as the reference voltage of the comparator, according to at least one of an output of the comparator and an output of the latch circuit. With this configuration, an output can be stabilized even if the input voltage fluctuates in the vicinity of the reference voltage, and the provision of the latch circuit makes it possible to stabilize an output also in the case where a sampling operation and a comparing operation are carried out a plurality of times sequentially.

In the above-described configuration, it is preferable that the circuit device includes a plurality of sets of the comparator, the reference voltage setting circuit, and the latch circuit, wherein voltage values in a reference voltage set of each reference voltage setting circuit are set so that voltage values for one reference voltage setting circuit do not to overlap voltage values for another reference voltage setting circuit.

The above-described circuit device preferably is configured so that in the case where a sampling operation and a comparing operation are performed with respect to the input voltage a plurality of times sequentially, when the input voltage compared with the reference voltage by the comparator has a value higher than that in a previous comparing operation and reaches the reference voltage of the comparator while exhibiting a rising transition during a current sampling period, a voltage value lower than the reference voltage is selected from the reference voltage set, and the selected voltage value is set as the reference voltage of the comparator.

With this configuration, the reference voltage of the comparator is switched according to the latest determination result, whereby the setting of the reference voltage according to the latest fluctuations of the input voltage is enabled at all times.

The above-described circuit device preferably is configured so that in the case where a sampling operation and a comparing operation are performed with respect to the input voltage a plurality of times sequentially, when the input voltage compared with the reference voltage by the comparator as a first comparator has a value lower than that in a previous comparing operation and reaches the reference voltage of the first comparator while exhibiting a rising transition during a current sampling period, a voltage value lower than the reference voltage is selected from the reference voltage set, and the selected voltage value is set as the reference voltage of the first comparator; and in the case where, in a previous comparing operation, the setting of a reference voltage was carried out with respect to a second comparator different from the first comparator, the setting of the reference voltage with respect to the second comparator is brought back to a previous setting.

Alternatively, the above-described circuit device preferably is configured so that in the case where a sampling operation and a comparing operation are performed with respect to the input voltage a plurality of times sequentially, when the input voltage compared with the reference voltage by the comparator as a first comparator has a value higher than that in a previous comparing operation and reaches the reference voltage of the first comparator while exhibiting a rising transition during a current sampling period, a voltage value lower than the reference voltage is selected from the reference voltage set, and the selected voltage value is set as the reference voltage of the first comparator; and in the case where, in a previous comparing operation, the setting of a reference voltage was carried out with respect to a second comparator different from the first comparator, the setting of the reference voltage with respect to the second comparator is brought back to a previous setting.

With these configurations, the reference voltage of the comparator is switched according to the latest determination result, whereby the setting of the reference voltage according to the latest fluctuations of the input voltage is enabled at all times. Besides, the reference voltage equivalent to the input voltage at the previous determining operation is reset to the initial state, whereby at the next determining operation using this reference voltage, the normal hysteresis operation is enabled.

The above-described circuit device preferably is configured so that in the case where a sampling operation and a comparing operation are performed with respect to the input voltage a plurality of times sequentially, when the input voltage compared with the reference voltage by the comparator has a value lower than that in a previous comparing operation and reaches the reference voltage of the comparator while exhibiting a falling transition during a current sampling period, a voltage value higher than the reference voltage is selected from the reference voltage set, and the selected voltage value is set as the reference voltage of the comparator.

With this configuration, the reference voltage of the comparator is switched according to the latest determination result, whereby the setting of the reference voltage according to the latest fluctuations of the input voltage is enabled at all times.

The above-described circuit device preferably is configured so that in the case where a sampling operation and a comparing operation are performed with respect to the input voltage a plurality of times sequentially, when the input voltage compared with the reference voltage by the comparator as a first comparator has a value higher than that in a previous comparing operation and reaches the reference voltage of the first comparator while exhibiting a falling transition during a current sampling period, a voltage value higher than the reference voltage is selected from the reference voltage set, and the selected voltage value is set as the reference voltage of the first comparator; and in the case where, in a previous comparing operation, the setting of a reference voltage was carried out with respect to a second comparator different from the first comparator, the setting of the reference voltage with respect to the second comparator is brought back to a previous setting.

Alternatively, the above-described circuit device preferably is configured so that in the case where a sampling operation and a comparing operation are performed with respect to the input voltage a plurality of times sequentially, when the input voltage compared with the reference voltage by the comparator as a first comparator has a value lower than that in a previous comparing operation and reaches the reference voltage of the first comparator while exhibiting a falling transition during a current sampling period, a voltage value higher than the reference voltage is selected from the reference voltage set, and the selected voltage value is set as the reference voltage of the first comparator; and in the case where, in a previous comparing operation, the setting of a reference voltage was carried out with respect to a second comparator different from the first comparator, the setting of the reference voltage with respect to the second comparator is brought back to a previous setting.

With this configuration, the reference voltage of the comparator is switched according to the latest determination result, whereby the setting of the reference voltage according to the latest fluctuations of the input voltage is enabled at all times. Besides, the reference voltage equivalent to the input voltage at the previous determining operation is reset to the initial state, whereby at the next determining operation using this reference voltage, the normal hysteresis operation is enabled.

To achieve the above-described object, electronic equipment of the present invention includes a sensor element and the circuit device described above. In this circuit device, an output of the sensor element is fed, as the input voltage, to the circuit device. The foregoing circuit device can feed out a stable determination result even if an output of the sensor element fluctuates in the vicinity of the reference voltage of the comparator due to influences of noises or the like. Therefore, electronic equipment characterized by stable operations and reduced wasteful power consumption can be provided.

The above-described electronic equipment preferably is configured so that the sensor element is a light sensor, and the device further includes: a liquid crystal module; a backlight stacked on the liquid crystal module; and adjusting means for adjusting brightness of the backlight according to an output of the circuit device. Even if an output of the sensor element fluctuates in the vicinity of the reference voltage of the comparator due to influences of noises or the like, the foregoing circuit device can feed out a stable determination result, without being affected by such fluctuations. Therefore, electronic equipment can be provided that is characterized in that the brightness of the backlight by no means becomes unstable due to influences of noises or the like and that wasteful power consumption is reduced.

Another exemplary circuit device according to the present invention includes a comparator that compares an input voltage fed from outside with a reference voltage selected from a reference voltage set including a plurality of voltage values that are different from one another, and amplifies the input voltage based on a result of the comparison. The circuit device further includes: a reference voltage setting circuit that selects a first voltage value from the reference voltage set when amplifying the input voltage in a voltage increasing direction, selects a second voltage value from the reference voltage set when amplifying the input voltage in a voltage decreasing direction, and sets the selected voltage value as the reference voltage of the comparator, wherein the first voltage value is lower than the second voltage value.

This makes it possible to realize a level shifter that provides abrupt rising upon amplification of a voltage in a voltage increasing direction and abrupt falling upon amplification of a voltage in a voltage decreasing direction; i.e., a level shifter that has an increased amplification speed.

EFFECT OF THE INVENTION

As described above, with the present invention, a circuit device that performs a certain processing operation with respect to an input signal by referring to a reference voltage and outputs the result is caused to have a function of switching the reference voltage. Thus, the present invention provides a circuit device with which a stable output can be obtained, and electronic equipment in which the foregoing circuit device is used.

DESCRIPTION OF THE INVENTION

The following is a detailed description of embodiments of the present invention, with reference to the accompanying drawings.

Embodiment 1

Figure 1:
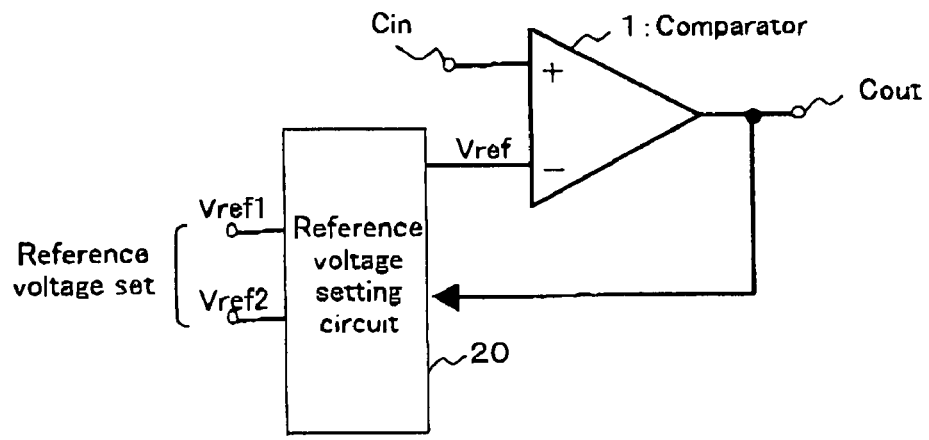
FIG. 1 is a circuit diagram showing a configuration of a circuit device according to Embodiment 1 of the present invention.

FIG. 1 is a circuit diagram showing a configuration of a circuit device according to Embodiment 1 of the present invention. As shown in FIG. 1, the circuit device according to the present embodiment includes a comparator 1 and a reference voltage setting circuit 20. The comparator 1 compares an input voltage $C_{in}$ fed from the outside with a reference voltage $V_{ref}$, and feeds out an output LOW when $C_{in} < V_{ref}$, or an output HIGH when $C_{in} > V_{ref}$. It should be noted that the comparison result ($C_{out}$) is fed to the reference voltage setting circuit 20, while being outputted through an output terminal of the comparator 1 to the outside. The reference voltage setting circuit 20 selects either $V_{ref1}$ or $V_{ref2}$ as the reference voltage $V_{ref}$ to be fed to the comparator 1, according to a value of the comparison result $C_{out}$. It should be noted that $V_{ref1} > V_{ref2}$.

Figure 2:
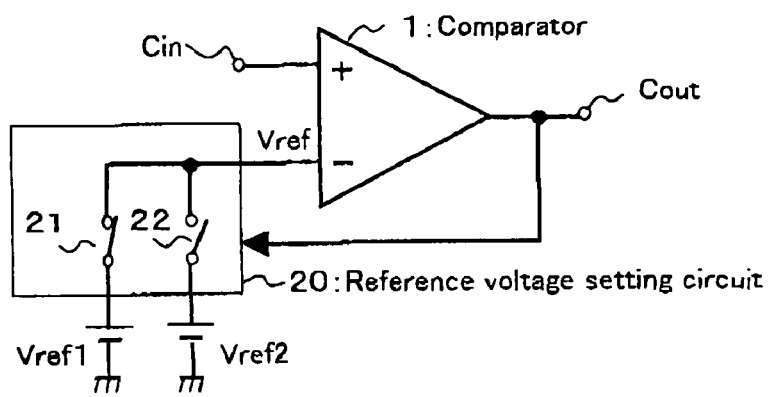
FIG. 2 is a circuit diagram showing a configuration of the circuit device according to Embodiment 1 of the present invention.

FIG. 2 is a circuit diagram showing an exemplary internal configuration of the reference voltage setting circuit 20. As shown in FIG. 2, the reference voltage setting circuit 20 has a pair of switches 21 and 22 that are turned ON/OFF exclusively. When the output $C_{out}$ of the comparator 1 is LOW (i.e., $C_{in} < V_{ref}$), the switch 21 is turned ON while the switch 22 is turned OFF, whereby the reference voltage $V_{ref}$ is set to $V_{ref1}$. On the other hand, when the output $C_{out}$ of the comparator 1 is HIGH (i.e., $C_{in} > V_{ref}$), the switch 21 is turned OFF while the switch 22 is turned ON, whereby the reference voltage $V_{ref}$ is set to $V_{ref2}$.

Figure 3:
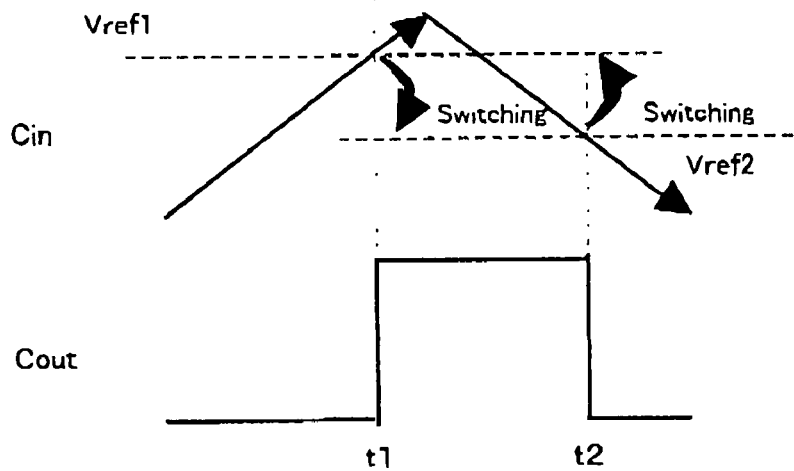
FIG. 3 is a waveform diagram showing an operation of the circuit device according to Embodiment 1.

With this configuration, the operation of the circuit device according to the present embodiment is as shown in FIG. 3. More specifically, in FIG. 3, it is assumed that initially the reference voltage $V_{ref}$ is set to $V_{ref1}$ (the switch 21 is ON, while the switch 22 is OFF), and the input voltage $C_{in}$ is lower than $V_{ref1}$. From this state, when the input voltage $C_{in}$ in a rising transition arrives at the reference voltage level $V_{ref}$ at a time t1, the output $C_{out}$ of the comparator 1 is switched from LOW to HIGH. With this, the switches 21 and 22 are turned OFF and ON, respectively, in the reference voltage setting circuit 20, whereby the reference voltage $V_{ref}$ is set to $V_{ref2}$.

Thereafter, when the input voltage $C_{in}$ in a falling transition arrives at the reference voltage level $V_{ref2}$ at a time t2, the output $C_{out}$ of the comparator 1 is switched from HIGH to LOW. With this, the switches 21 and 22 are turned ON and OFF, respectively, in the reference voltage setting circuit 20, whereby the reference voltage $V_{ref}$ is set to $V_{ref1}$.

Figure 4:
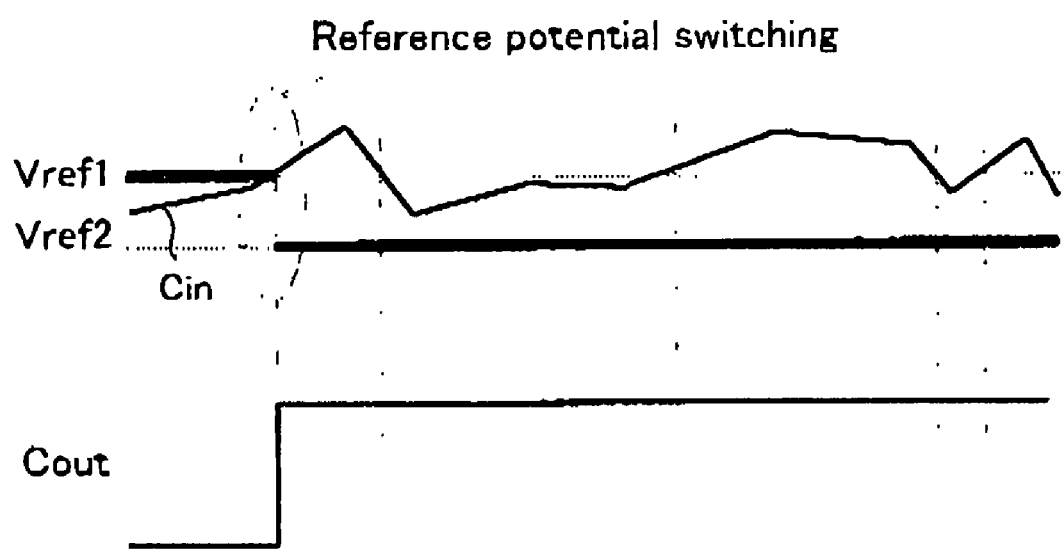
FIG. 4 is a waveform diagram showing an effect of the circuit device according to Embodiment 1.

As described above, after the input voltage $C_{in}$ in a rising transition arrives at the reference voltage level $V_{ref1}$, the reference voltage $V_{ref}$ is set to the reference voltage level $V_{ref2}$ lower than $V_{ref1}$. By so doing, even if thereafter the input voltage $C_{in}$ slightly fluctuates above/below $V_{ref1}$ as shown in FIG. 4, the fluctuations hardly affect the output $C_{out}$ of the comparator 1. Likewise, after the input voltage $C_{in}$ in a falling transition arrives at the reference voltage level $V_{ref2}$, the reference voltage $V_{ref}$ is set to the reference voltage level $V_{ref1}$ higher than $V_{ref2}$. By so doing, even if thereafter the input voltage $C_{in}$ slightly fluctuates in the vicinity of the reference voltage level $V_{ref2}$, the fluctuations hardly affect the output $C_{out}$ of the comparator 1. Thus, with the circuit device according to the present embodiment, a stable output can be obtained even if there are influences of noises or the like.

It should be noted that an exemplary configuration in which the reference voltage $V_{ref}$ is set to either one of two potentials $V_{ref1}$ and $V_{ref2}$ is described above as the present embodiment, but the circuit device may be configured such that the reference voltage is set to one selected from three or more potentials. For example, in the case where the reference voltage $V_{ref}$ can be selected from $V_{ref1}$, $V_{ref2}$, .... $V_{refn}$ ($V_{ref1}$> $V_{ref2}$> ... >$V_{refn}$), when the input voltage $C_{in}$ in a rising transition arrives at the reference voltage level $V_{refi}$ ($1 \leq i < n$), the reference voltage $V_{ref}$ may be set to $V_{ref(i+1)}$ lower than the reference voltage level $V_{refi}$. When the input voltage $C_{in}$ in a falling transition arrives at a reference voltage level $V_{refi}$ ($1 < i \leq n$), the reference voltage $V_{ref}$ may be set to $V_{ref(i-1)}$ higher than the reference voltage level $V_{refi}$.

Figure 5:
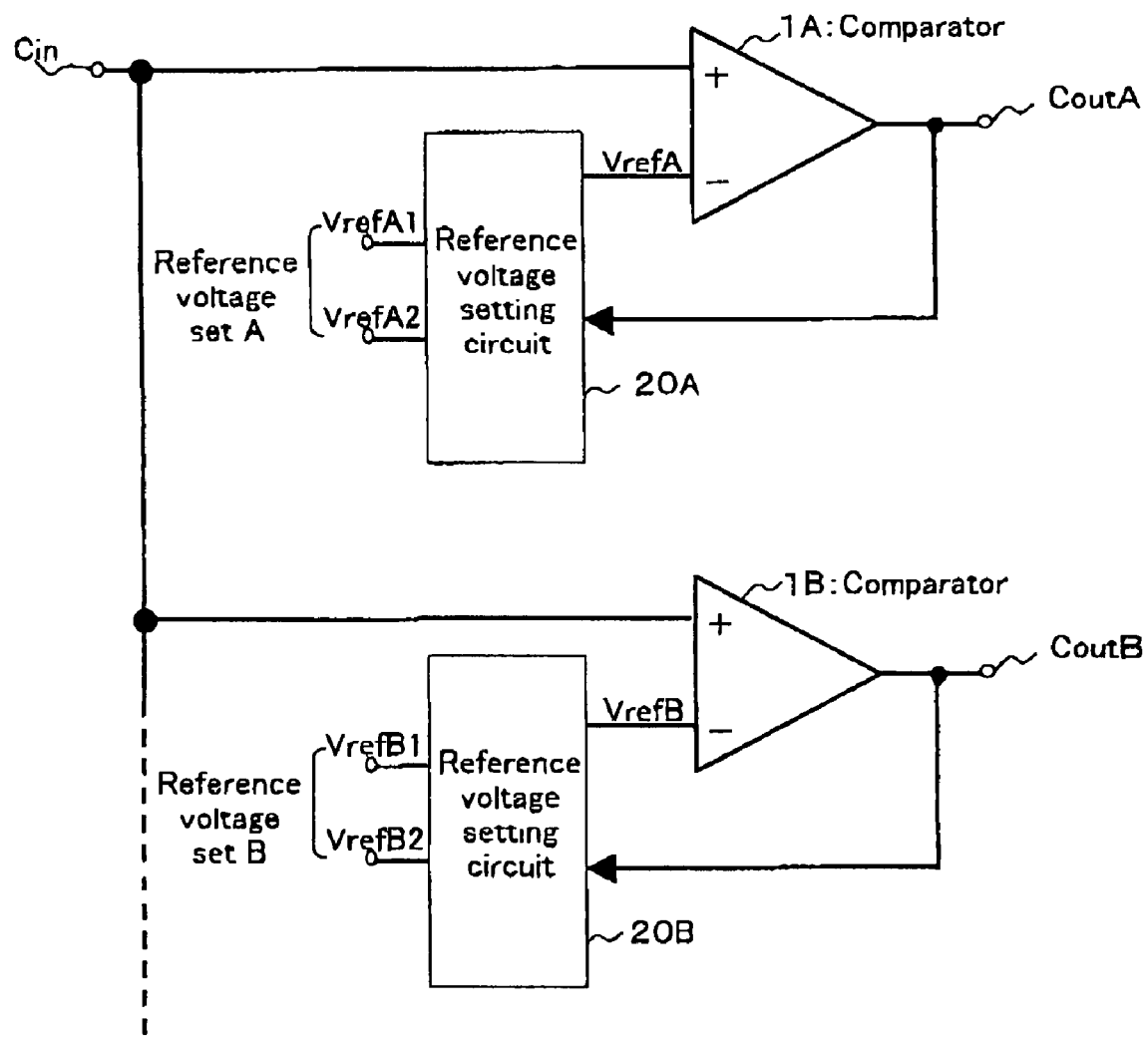
FIG. 5 is a circuit diagram showing another exemplary configuration of a circuit device according to Embodiment 1.

Besides, as shown in FIG. 5, a circuit device including a plurality of sets of the comparator 1 and the reference voltage setting circuit 20 shown in FIG. 1 is an embodiment of the present invention also. In FIG. 5, comparators designated with reference numerals of 1A and 1B have the same function as that of the comparator 1 shown in FIG. 1. Reference voltage setting circuits designated with reference numerals of 20A and 20B have the same function as that of the reference voltage setting circuit 20 shown in FIG. 1.

In the configuration shown in FIG. 5, the input voltage $C_{in}$ is fed to each of the comparators 1A, 1B, .... Reference voltage levels $V_{refA}$, $V_{refB}$, ..., which are different from one another, are fed to the comparators 1A, 1B, ..., respectively, and are compared with the input voltage $C_{in}$, so that comparison results ($C_{outA}$, $C_{outB}$, ...) are fed out as HIGH or LOW. It is possible to determine the magnitude of the input voltage $C_{in}$ to be one of a plurality of degrees based on $C_{outA}$, $C_{outB}$, ....

The results $C_{outA}$, $C_{outB}$, ... are fed to the reference voltage setting circuits 20A, 20B, ... also. The reference voltage setting circuit 20A selects one of the reference voltage levels $V_{refA1}$, and $V_{refA2}$ according to the transition of the output $C_{outA}$ of the comparator 1A and sets the same as the reference voltage $V_{refA}$. Likewise, the reference voltage setting circuit 20B selects one of the reference voltage levels $V_{refB1}$ and $V_{refB2}$ according to the transition of the output $C_{outB}$ of the comparator 1B and sets the same as the reference voltage $V_{refB}$. It should be noted that respective potentials of $V_{refA1}$, $V_{refA2}$, $V_{refB1}$, $V_{refB2}$, . . . are set so as to satisfy $V_{refA1}$>$V_{refA2}$>$V_{refB1}$>$V_{refB2}$ ....

Embodiment 2

The following is a description of a circuit device according to Embodiment 2 of the present invention. It should be noted that members having the same functions as those of Embodiment 1 described above are designated with the same reference numerals as those in Embodiment 1, and detail descriptions of the same are omitted herein.

Figure 6:
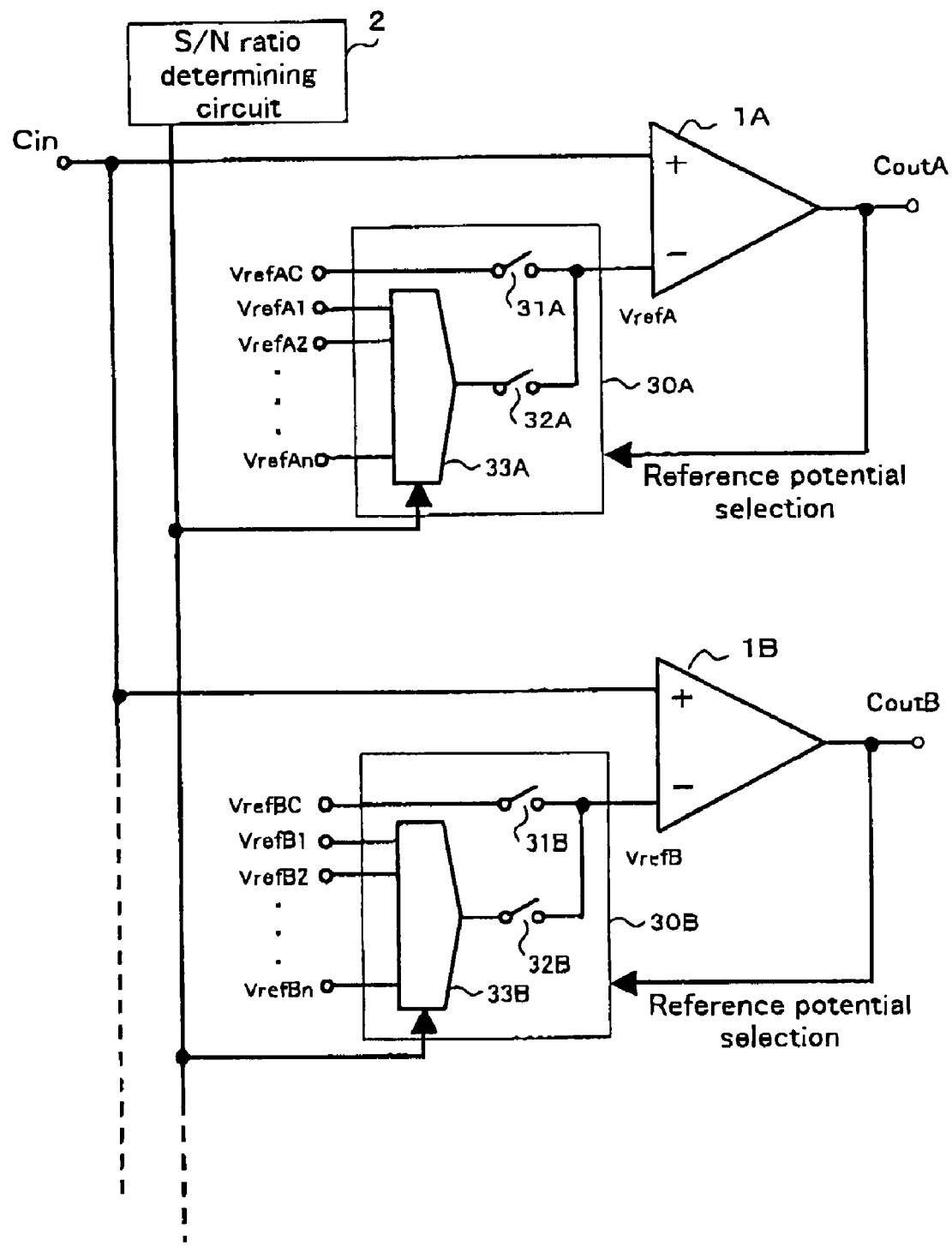
FIG. 6 is a circuit diagram showing a configuration of a circuit device according to Embodiment 2 of the present invention.

FIG. 6 is a circuit diagram showing a configuration of a circuit device according to Embodiment 2 of the present invention. As shown in FIG. 6, the circuit device of the present embodiment includes a plurality of sets of a comparator 1 and a reference voltage setting circuit 30; and an S/N ratio determining circuit 2 for measuring a S/N ratio of an input signal. In FIG. 6, comparators designated with reference numerals of 1A and 1B have the same function as that of the comparator 1 shown in FIG. 1. Reference voltage setting circuits designated with reference numerals of 30A and 30B have functions identical to one another (which will be described later).

In the configuration shown in FIG. 6, an input voltage $C_{in}$ is fed to each of the comparators 1A, 1B, .... Reference voltage levels $V_{refA}$, $V_{refB}$, ..., which are different from one another, are fed to the comparators 1A, 1B, ..., respectively, and are compared with the input voltage $C_{in}$, so that comparison results ($C_{outA}$, $C_{outB}$, ...) are fed out as outputs HIGH or LOW. It is possible to determine the magnitude of the input voltage $C_{in}$ to be one of a plurality of levels based on $C_{outA}$, $C_{outB}$, ....

The reference voltage setting circuit 30A includes a pair of switches 31A and 32B that are turned ON/OFF exclusively and a hysteresis voltage selecting circuit 33A. When a switch 31A is turned ON, a constant potential $V_{refAC}$ is fed as a reference voltage $V_{refA}$ for the comparator 1A. When a switch 32A is turned ON, a voltage selected by the hysteresis voltage selecting circuit 33A among hysteresis potentials $V_{refA1}$, $V_{refA2}$, ... $V_{refAn}$ is fed as the reference voltage $V_{refA}$ for the comparator 1A. It should be noted that the potentials $V_{refAC}$, $V_{refA1}$, $V_{refA2}$, . . . $V_{refAn}$ are set so as to satisfy $V_{refAC}$>$V_{refA1}$>$V_{refA2}$> ... >$V_{refAn}$.

Figure 7:
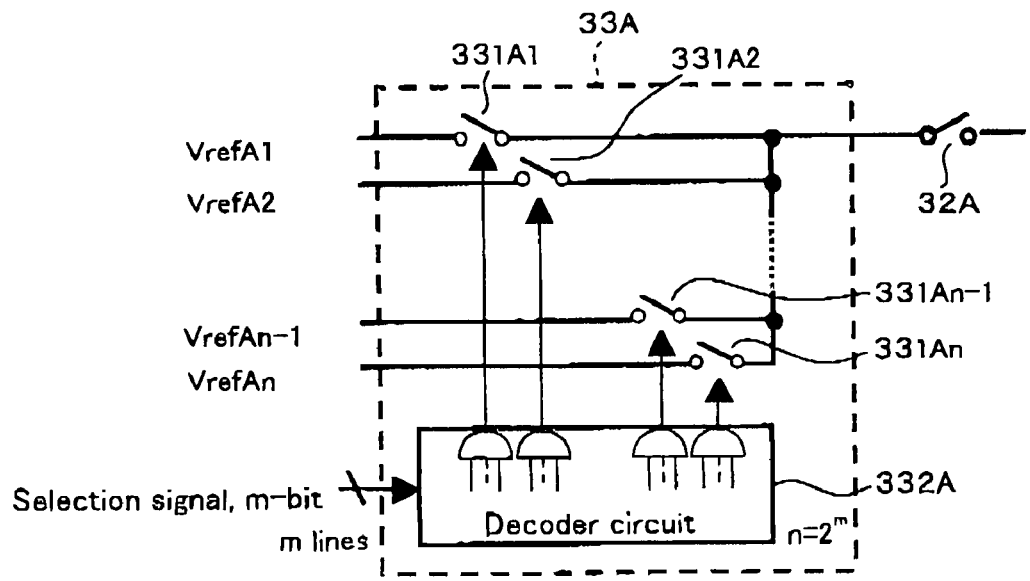
FIG. 7 is a circuit diagram showing an internal configuration of a hysteresis voltage selecting circuit provided in the circuit device according to Embodiment 2 of the present invention.

The hysteresis voltage selecting circuit 33A determines which potential should be selected from the hysteresis potentials $V_{refA1}$, $V_{refA2}$, ... $V_{refAn}$ based on the S/N ratio of the input signal ($C_{in}$). In order to do so, the hysteresis voltage selecting circuit 33A includes a decoder circuit 332A and switches $331A_1$ to $331A_n$ as shown in FIG. 7. The decoder circuit 332A receives an m-bit selection signal ($n=2^m$) based on the S/N ratio of the input signal ($C_{in}$), and one of the swatches $331A_1$ to $331A_n$ is selected according to the selection signal and is turned ON.

It should be noted that the above-described selection signal is set by the S/N ratio determining circuit 2 in the following manner: a switch $331A_1$ is selected when the S/N ratio is highest; as the S/N ratio decreases from the highest value, the switches $331A_z$, $331A_s$, ... are selected sequentially; and a switch $331A_n$ is selected when the S/N ratio is lowest.

The following is a description of an operation of the circuit device of the present embodiment having the above-described configuration.

Figure 8:
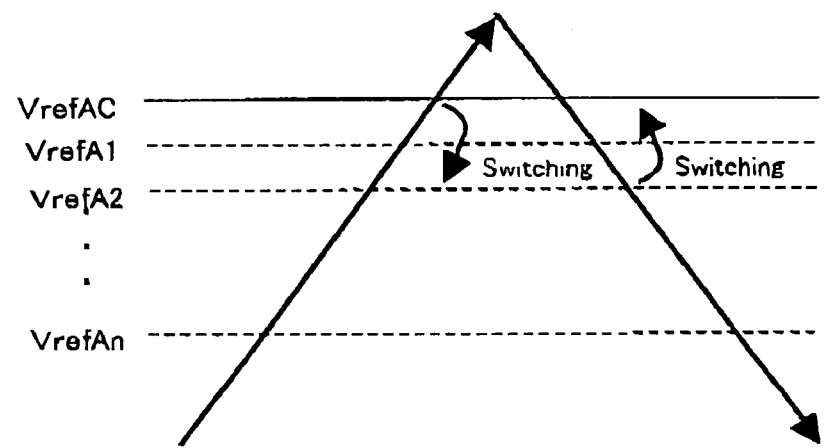
FIG. 8 is a waveform diagram showing an operation of the circuit diagram according to Embodiment 2 of the present invention.

It is assumed that initially the reference voltage $V_{refA}$ is set to $V_{refAC}$ (the switch 31A is ON, the switch 32A is OFF), and the input voltage $C_{in}$ is lower than $V_{refA}$. From this state, as shown in FIG. 8, the input voltage $C_{in}$ in a rising transition arrives at the reference voltage $V_{refA}$, and then the output $C_{outA}$ of the comparator 1A is switched from LOW to HIGH. With this, the reference voltage setting circuit 30A turns the switch 31A OFF and turns the switch 32A ON. Here, simultaneously, the hysteresis voltage selecting circuit 33A selects one of the switches $331A_1$ to $331A_n$ and turns the selected switch ON according to the selection signal fed from the S/N ratio determining circuit 2. For example, in the example shown in FIG. 8, the switch $331A_2$ is turned ON, which results in that the hysteresis potential $V_{refA2}$ is set as the reference voltage $V_{refA}$ of the comparator 1A.

Thereafter, when the input voltage $C_{in}$ in a falling transition arrives at the reference voltage $V_{refA}$ (i.e., $V_{refA2}$), the reference voltage setting circuit 30A turns the switch 32A OFF and turns the switch 31A ON. Consequently, the reference voltage $V_{refA}$ is set to $V_{refAC}$.

As described above, after the input voltage $C_{in}$ in a rising transition arrives at the reference voltage $V_{refAC}$, a potential selected from the hysteresis potentials $V_{refA1}$, $V_{refA2}$, .... $V_{refAn}$ in accordance with the S/N ratio of the input signal ($C_{in}$) is set as the reference voltage $V_{refA}$. By so doing, even if thereafter the input voltage $C_{in}$ slightly fluctuates above/below $V_{refAC}$, the fluctuations hardly affect the output $C_{in}$ of the comparator 1A. Thus, with the circuit device according to the present embodiment, a stable output can be obtained even there are influences of noises or the like.

It should be noted that the above description is made regarding the combination of the comparator 1A and the reference voltage setting circuit 30A, but a configuration of a combination of the comparator 1B and the reference voltage setting circuit 30B, etc., and an operation performed by the foregoing combination are the same as those described above. Here, the reference potentials for the foregoing sets axe set so as to satisfy $V_{refAC} > V_{refA1} > V_{refA2} > \ldots > V_{refAn} > V_{refBC} > V_{refB1} > V_{refB2} > \ldots > V_{refBn} > V_{refCC} > V_{refC1} > V_{refC2} > \ldots > V_{refCn} \ldots$, whereby the magnitude of the input voltage $C_{in}$ can be determined to be one of a plurality of levels.

It should be noted that the number of the sets of the comparator 1 and the reference voltage setting circuit 30 is arbitrary in the circuit device according to the present embodiment.

In the present embodiment, an initial value of the reference voltage is set to the highest potential ($V_{refAC}$) in the set of the reference voltage levels, and when the input voltage $C_{in}$ in a rising transition arrives at the highest reference voltage level, a hysteresis potential lower than $V_{refAC}$ is selected in accordance with the S/N ratio of the input signal ($C_{in}$) so as to be set as the reference voltage. Thereafter, when the input voltage $C_{in}$ in a falling transition arrives at the foregoing reference voltage level, the reference voltage is reset to $V_{refAC}$.

However, the configuration of the present invention is not limited to this, and may be as follows. The initial value of the reference voltage is set to the lowest potential in the set of the reference voltage levels, and when the input voltage $C_{in}$ in a falling transition arrives at the foregoing lowest reference voltage level, a hysteresis potential higher than that is selected in accordance with the S/N ratio of the input signal ($C_{in}$) so as to be set as the reference voltage. Thereafter, when the input voltage $C_{in}$ in a rising transition arrives at the foregoing reference voltage level, the reference voltage is reset to the above-described initial value.

Embodiment 3

The following is a description of a circuit device according to Embodiment 3 of the present invention. It should be noted that members having the same functions as those of the above-described embodiments are designated with the same reference numerals as those in the above described embodiments, and detail descriptions of the same are omitted herein.

Figure 9:
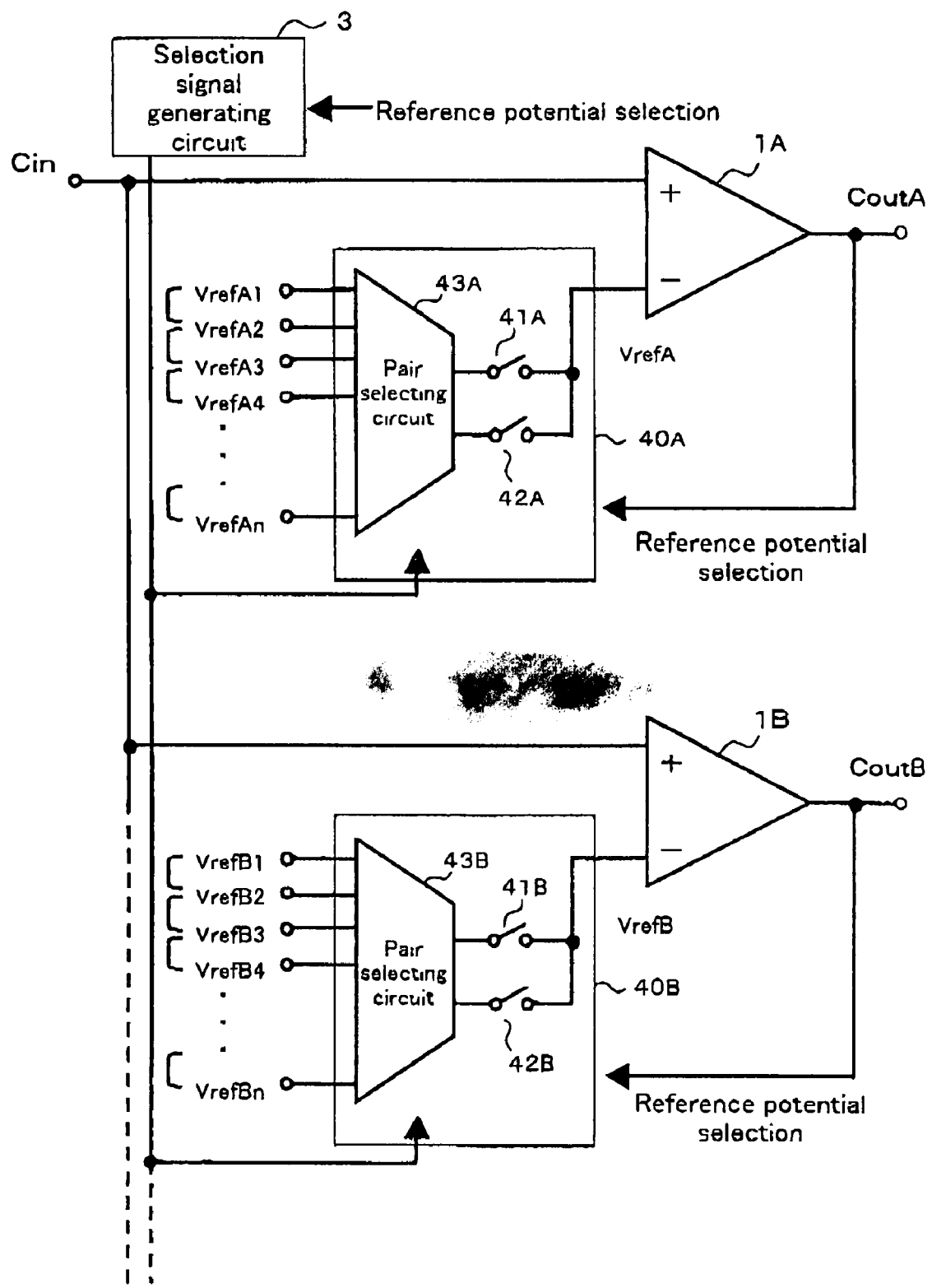
FIG. 9 is a circuit diagram showing a configuration of a circuit device according to Embodiment 3 of the present invention.

FIG. 9 is a circuit diagram showing a configuration of a circuit device according to Embodiment 3 of the present invention. As shown in FIG. 9, the circuit device according to the present embodiment includes a plurality of sets of a comparator 1 and a reference voltage setting circuit 40; and a selection signal generating circuit 3. In FIG. 9, the comparators designated with reference numerals of 1A and 1B have the same function as that of the comparator 1 shown in FIG. 1. Reference voltage setting circuits designated with reference numerals of 40A and 40B have functions identical to one another (which will be described later).

In the configuration shown in FIG. 9, an input voltage $C_{in}$ is fed to each of the comparators 1A, 1B, . . . . Reference voltage levels $V_{refA}$, $V_{refB}$, . . . , which are different from one another, are fed to the comparators 1A, 1B, . . . , respectively, and are compared with the input voltage $C_{in}$, so that comparison results ($C_{outA}$, $C_{outB}$, . . . ) are fed out as outputs HIGH or LOW. It is possible to determine the magnitude of the input voltage $C_{in}$ to be one of a plurality of levels based on $C_{outA}$, $C_{outB}$, . . . .

The reference voltage setting circuit 40A includes a pair of switches 41A and 42A that are turned ON/OFF exclusively and a pair selecting circuit 43A. The pair selecting circuit 43A selects one pair of potentials from n potentials, i.e., $V_{refA1}$, $V_{refA2}$, . . . $V_{refAn}$, according to a selection signal fed from the selection signal generating circuit 3. The selection signal generating circuit 3 receives an input for designating a reference potential, and generates a selection signal in accordance with the input. A value given as the input for designating a reference potential may be written or in a ROM or the like (not shown) in this circuit device during the manufacturing process or in a ROM or the like (not shown) outside this circuit device. Alternatively, the input for designating a reference potential may be entered by a user or a circuit or the like outside this circuit device while the circuit device is operating. The switch 41A, when turned ON, feeds either one of a pair of potentials selected by the pair selecting circuit 43A to the comparator 1. The switch 42A, when turned ON, feeds the other one of the pair of potentials selected by the pair selecting circuit 43A to the comparator 1.

Figure 10:
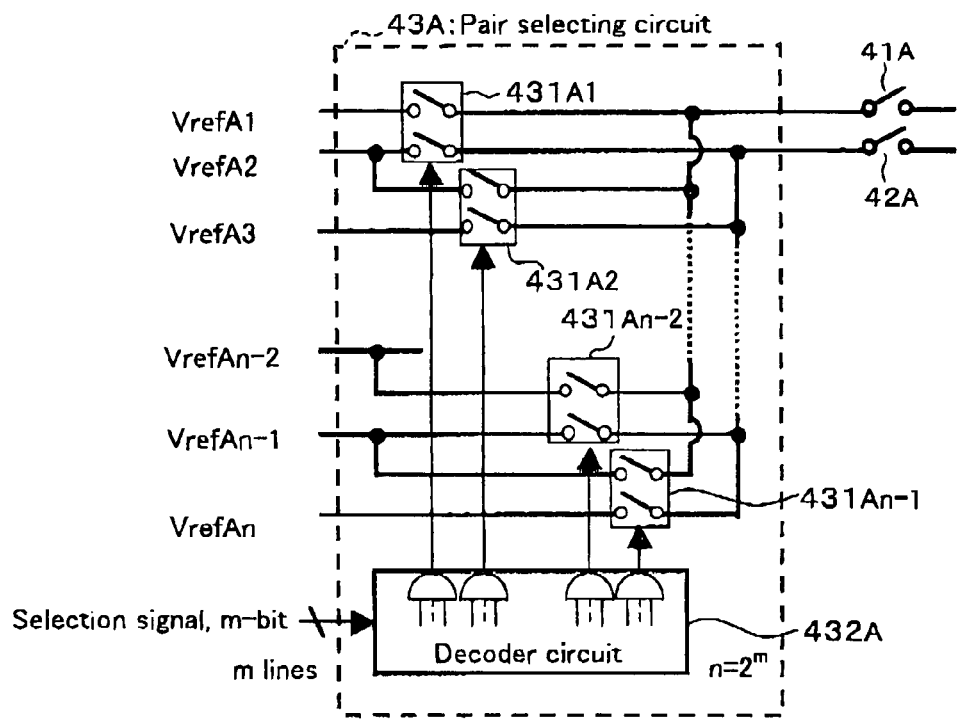
FIG. 10 is a circuit diagram showing an internal configuration of a hysteresis voltage selecting circuit provided in the circuit device according to Embodiment 3 of the present invention.

In order to do so, as shown in FIG. 10, the pair selecting circuit 43A includes switches $431A_1$ to $431A_{n-1}$ and a decoder circuit 432A. The decoder circuit 432A receives a selection signal fed from the selection signal generating circuit 3, and selects one of the switches $431A_1$ to $431A_{n-1}$ according to this selection signal and turns the selected switch ON. When the switch $431A_1$, for example, is turned ON, the reference voltage $V_{refA1}$ is fed to the switch 41A while the reference voltage $V_{ref2}$ is fed to the switch 42A. When the switch $431A_2$ is turned ON, the reference voltage $V_{refA2}$ is fed to the switch 41A while the reference voltage $V_{refA3}$ is fed to the switch 42A. It should be noted that the potentials $V_{refA1}$, $V_{refA2}$, . . . $V_{refAn}$ are set so as to satisfy $V_{refA1} > V_{refA2} > \ldots > V_{refAn}$.

Next, the following is a description of an operation of the circuit device according to the present embodiment having the above-described configuration.

Here, it is assumed that the switch $431A_2$ is turned ON in response to the selection signal fed from the selection signal generating circuit 3. In other words, the reference voltage $V_{refA2}$ is fed to the switch 41A while the reference voltage $V_{refA3}$ is fed to the switch 42A. Further, it is assumed that the switch 41A is ON while the switch 42A is OFF, and that the reference voltage $V_{refA}$ of the comparator 1A is set to $V_{refA2}$.

Figure 11:
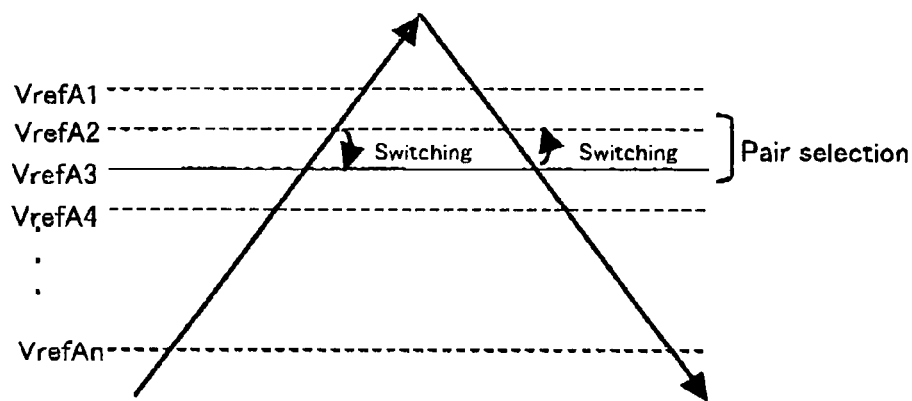
FIG. 11 is a waveform diagram showing an operation of the circuit device according to Embodiment 3 of the present invention.

In this state, when the input voltage $C_{in}$ in a rising transition arrives at the reference $V_{refA2}$ as shown in FIG. 11, the output $C_{outA}$ of the comparator 1A is switched from LOW to HIGH. In response to this, the reference voltage setting circuit 40A turns the switch 41A OFF and turns the switch 42A ON. This causes the reference voltage $V_{refA}$ of the comparator 1A to be set to $V_{refAS}$.

Thereafter, when the input voltage $C_{in}$ in a falling transition arrives at the reference voltage $V_{refA}$ (i.e., $V_{refA3}$), the reference voltage setting circuit 40A turns the switch 42A OFF and turns the switch 41A ON. This causes the reference voltage $V_{refA}$ to be set to $V_{refA2}$ again.

As described above, with the circuit device according to the present embodiment also, a stable output can be obtained even if there are influences of noises or the like.

It should be noted that the above description is made regarding only the combination of the comparator 1A and the reference voltage setting circuit 40A, but a configuration such as a combination of the comparator 1B and the reference voltage setting circuit 40B, etc., and an operation performed by the foregoing combination are the same as those described above. Here, the reference potentials of the foregoing sets are set so as to satisfy $V_{refA1}>V_{refA2}> \ldots >V_{refAn}>V_{refB1}>V_{refB2}> \ldots >V_{refBn}>V_{refC1}>V_{refC2}> \ldots >V_{refCn} \ldots$, whereby the magnitude of the input voltage $C_{in}$ can be determined to be one of a plurality of levels.

It should be noted that the number of the sets of the comparator 1 and the reference voltage setting circuit 40 is arbitrary in the circuit device according to the present embodiment.

Embodiment 4

The following is a description of a circuit device according to Embodiment 4 of the present invention. It should be noted that members having the same functions as those of the above-described embodiments are designated with the same reference numerals as those in the above-described embodiments, and detail descriptions of the same are omitted herein.

Figure 12:
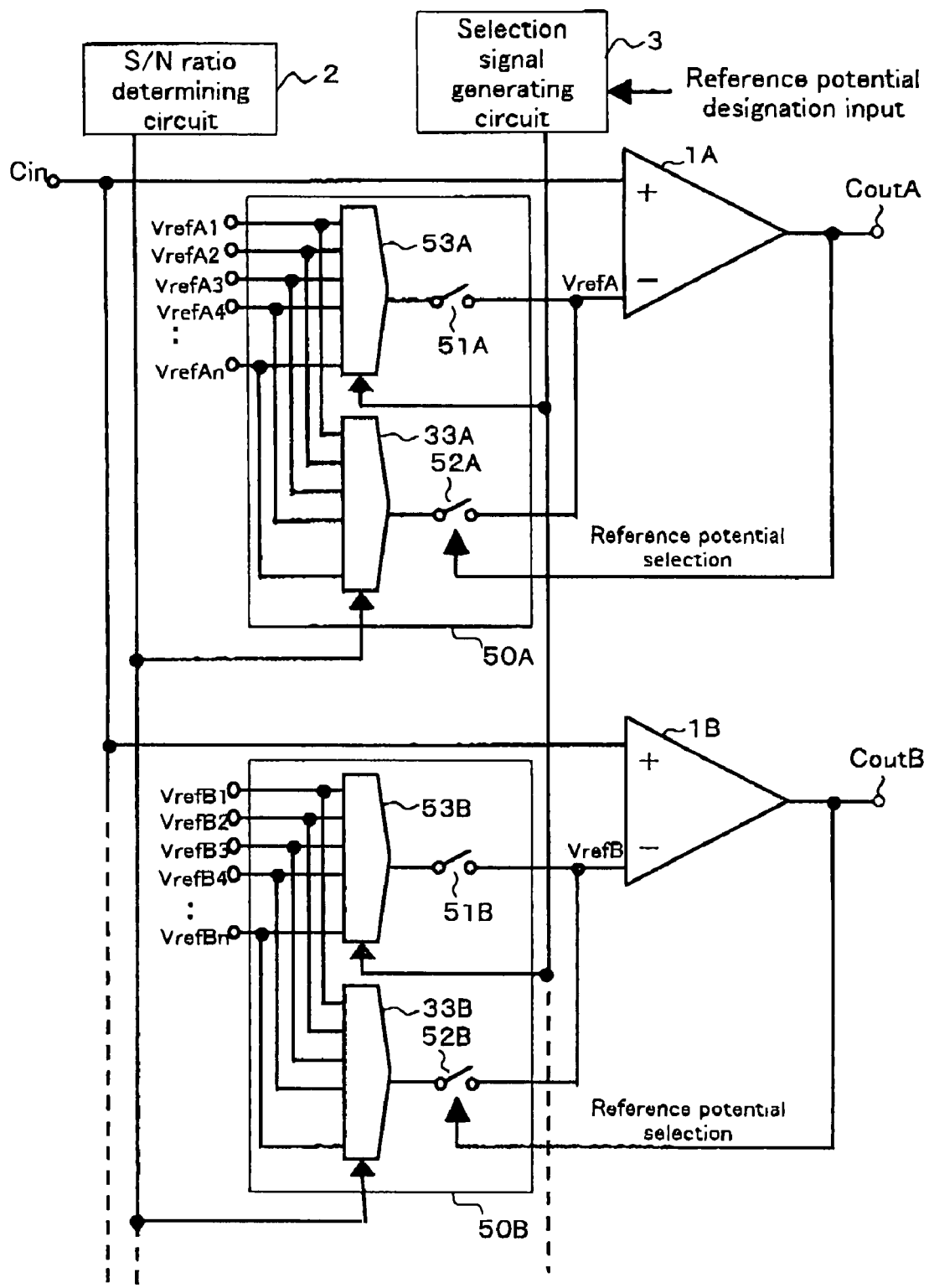
FIG. 12 is a circuit diagram showing a configuration of a circuit device according to Embodiment 4 of the present invention.

FIG. 12 is a circuit diagram showing a configuration of a circuit device according to Embodiment 4 of the present invention. As shown in FIG. 12, the circuit device according to the present embodiment includes a plurality of sets of a comparator 1 and a reference voltage setting circuit 50; an S/N ratio determining circuit 2 for measuring an S/N ratio of an input signal; and a selection signal generating circuit 3. In FIG. 12, the comparators designated with reference numerals of 1A and 1B have the same function as that of the comparator 1 shown in FIG. 1. Reference voltage setting circuits designated with reference numerals of 50A and 50B have functions identical to one another (which will be described later).

In the configuration shown in FIG. 12, an input voltage $C_{in}$ is fed to each of the comparators 1A, 1B . . . . Reference voltage levels $V_{refA}$, $V_{refB}$, . . . , which are different from one another, are fed to the comparators 1A, 1B, . . . , respectively, and are compared with the input voltage $C_{in}$, so that comparison results ($C_{outA}$, $C_{outB}$, . . . ) are fed out as outputs HIGH or LOW. It is possible to determine the magnitude of the input voltage $C_{in}$ to be one of a plurality of levels based on $C_{outA}$, $C_{outB}$, . . . .

The reference voltage setting circuit 50A includes a pair of switches 51A and 52A that are turned ON/OFF exclusively, a reference voltage selecting circuit 53A, and a hysteresis voltage selecting circuit 33A The hysteresis voltage selecting circuit 33A is identical to that of Embodiment 2 described above in detail, and therefore the detailed description of the same is omitted herein.

When the switch 51A is turned ON, a voltage selected from $V_{refA1}$, $V_{refA2}$, . . . $V_{refAn}$ by the reference voltage selecting circuit 53A according to a selection signal fed from the selection signal generating circuit 3 is fed to the comparator 1A as a reference voltage $V_{refA}$. When the switch 52A is turned ON, a voltage selected from $V_{refA1}$, $V_{refA2}$, . . . $V_{refAn}$ by the hysteresis voltage selecting circuit 33A according to a selection signal fed from the S/N ratio determining circuit 2 is fed to the comparator 1A as a reference voltage $V_{refA}$. It should be noted that the potentials $V_{refA1}$, $V_{refA2}$, . . . $V_{refAn}$ are set so as to satisfy $V_{refAC}>V_{refA1}>V_{refA2}> \ldots >V_{refAn}$.

Figure 13:
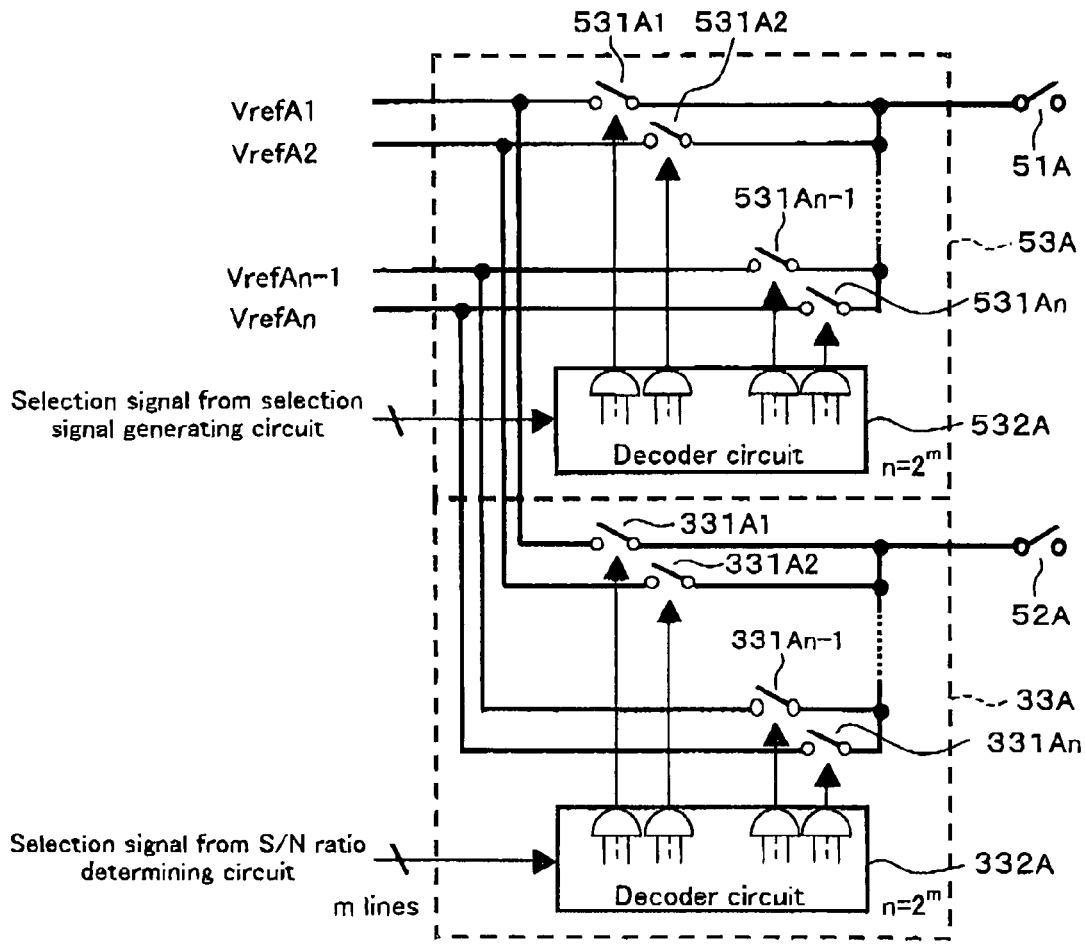
FIG. 13 is a circuit diagram showing an internal configuration of a hysteresis voltage selecting circuit provided in the circuit device according to Embodiment 4 of the present invention.

The reference voltage selecting circuit 53A selects one potential from $V_{refA1}$, $V_{refA2}$, . . . . $V_{refAn}$ according to the selection signal fed from the selection signal generating circuit 3. In order to do so, as shown in FIG. 13, the reference voltage selecting circuit 53A includes a decoder circuit 532A and switches $531A_1$ to $531A_n$. The decoder circuit 532A receives an m-bit selection signal ($n=2^m$) fed from the selection signal generating circuit 3, and selects one of the switches $531A_1$ to $531A_n$ according to this selection signal and turns the selected switch ON.

Next, the following is a description of an operation of the circuit device according to the present embodiment having the above-described configuration.

Here, it is assumed that the switch $531A_2$ is turned ON in response to the selection signal fed from the selection signal generating circuit 3. In other words, the reference voltage $V_{refA2}$ is fed to the switch 51A. Further, it is assumed that the switch 51A is ON while the switch 52A is OFF, and that the reference voltage $V_{refA}$ of the comparator 1A is set to $V_{refA2}$.

Figure 14:
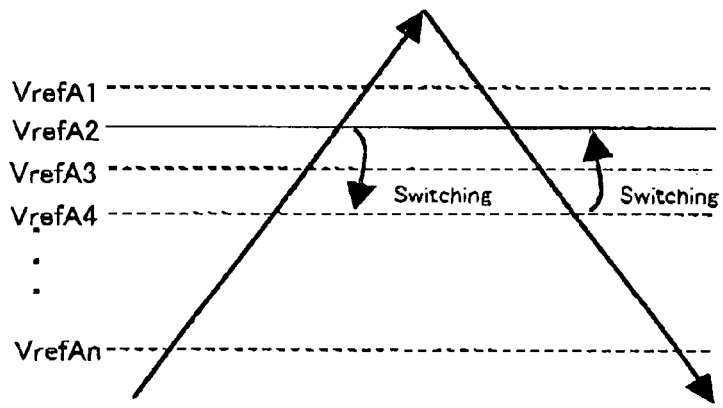
FIG. 14 is a circuit diagram showing an operation of the circuit device according to Embodiment 4 of the present invention.

In this state, when the input voltage $C_{in}$ in a rising transition arrives at the reference $V_{refA}$ (i.e., $V_{refA2}$) as shown in FIG. 14, the output $C_{outA}$ of the comparator 1A is switched from LOW to HIGH. With this, the reference voltage setting circuit 50A turns the switch 51A OFF and turns the switch 52A ON. At the same time, the hysteresis voltage selecting circuit 33A selects one of the switches $331A_1$ to $331A_n$ according to a selection signal fed from the S/N ratio determining circuit 2, and turns the selected switch ON. For example, in the example shown in FIG. 14, the switch $331A_4$ is turned ON, whereby a hysteresis potential $V_{refA4}$ is set as a reference voltage $V_{refA}$ for the comparator 1A.

Thereafter, when the input voltage $C_{in}$ in a falling transition arrives at the reference voltage $V_{refA}$ (i.e., $V_{refA4}$), the reference voltage setting circuit 50A turns the switch 52A OFF and turns the switch 51A ON. This causes the reference voltage $V_{refA}$ to be set to $V_{refA2}$ again.

As described above, with the circuit device according to the present embodiment also, a stable output can be obtained even if there are influences of noises or the like.

It should be noted that the above description is made regarding the combination of the comparator 1A and the reference voltage setting circuit 50A, but a configuration such as a combination of the comparator 1B and the reference voltage setting circuit 50B, etc., and an operation performed by the foregoing combination are the same as those described above. Here, the reference potentials of the foregoing sets are set so as to satisfy $V_{refA1}>V_{refA2}> \ldots >V_{refAn}>V_{refB1}>V_{refB2}> \ldots >V_{refBn}>V_{refC1}>V_{refC2}> \ldots >V_{refCn} \ldots$, whereby the magnitude of the input voltage $C_{in}$ can be determined to be one of a plurality of levels.

It should be noted that the number of the sets of the comparator 1 and the reference voltage setting circuit 50 is arbitrary in the circuit device according to the present embodiment.

Embodiment 5

The following is a description of a circuit device according to Embodiment 5 of the present invention. It should be noted that members having the same functions as those of the above-described embodiments are designated with the same reference numerals as those in the above-described embodiments, and detail descriptions of the same are omitted herein.

Figure 15:
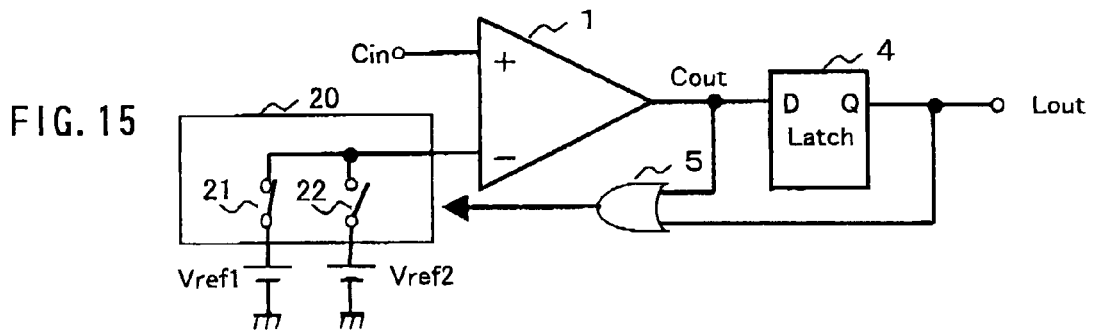
FIG. 15 is a circuit diagram showing a configuration of a circuit device according to Embodiment 5 of the present invention.

FIG. 15 is a circuit diagram showing a configuration of a circuit device according to Embodiment 5 of the present invention. As clear from FIGS. 15 and 2 compared with each other, the circuit device according to the present embodiment has a configuration in which a latch circuit 4 and an OR circuit 5 are added to the circuit device according to Embodiment 1 shown in FIG. 2. The circuit device according to the present embodiment performs a sampling operation and a comparing operation a plurality of times sequentially with respect to an input voltage $C_{in}$, and feeds out the result of the foregoing operations as an output $L_{out}$ from the latch circuit 4.

The output $C_{out}$ of the comparator 1 and the output $L_{out}$ of the latch circuit 4 are fed to the OR circuit 5, and the result of the OR operation is fed to the reference voltage setting circuit 20. The reference voltage setting circuit 20 turns the switch 21 ON when LOW is fed thereto, while it turns the switch 22 ON when HIGH is fed thereto, like in Embodiment 1.

The following is a description of an operation of the circuit device according to the present embodiment having the configuration described above, with reference to FIGS. 16 and 17. It is assumed that initially the switch 21 is ON while the switch 22 is OFF, and the reference voltage $V_{ref}$ of the comparator 1 is set to $V_{ref1}$. It is assumed that in this state a pulse as shown in FIG. 16 is fed thereto as an input voltage $C_{in}$.

Since a peak voltage of the first pulse P1 does not arrive at the reference voltage $V_{ref1}$, the output $C_{out}$ of the comparator 1 is LOW. The latch circuit 4 latches the output $C_{out}$ of the comparator 1 at latch timings indicated by circle marks on the line indicating the output $C_{out}$ of the comparator 1 in FIG. 16. Therefore, at the first latch timing (at a time t1 shown in FIG. 16), the output $L_{out}$ of the latch circuit 4 is LOW also. Since the output of the OR circuit 5 also is LOW, the reference voltage setting circuit 20 therefore maintains the switches 21 and 22 in the ON state and the OFF state, respectively. Thus, the reference voltage of the comparator 1 is maintained at $V_{ref1}$.

Since the peak value of the input voltage $C_{in}$ in the second pulse P2 thereof exceeds the reference voltage $V_{ref1}$ at a time t2, the output $C_{out}$ of the comparator 1 is switched from LOW to HIGH. This causes the output of the OR circuit 5 to be HIGH at the time t2, and the switch 21 of the reference voltage setting circuit 20 is turned OFF, while the switch 22 thereof is turned ON, whereby the reference voltage $V_{ref}$ of the comparator 1 is switched from $V_{ref1}$ to $V_{ref2}$. Thereafter, the output $L_{out}$ of the latch circuit 4 is switched from LOW to HIGH at a time t3.

Figure 16:
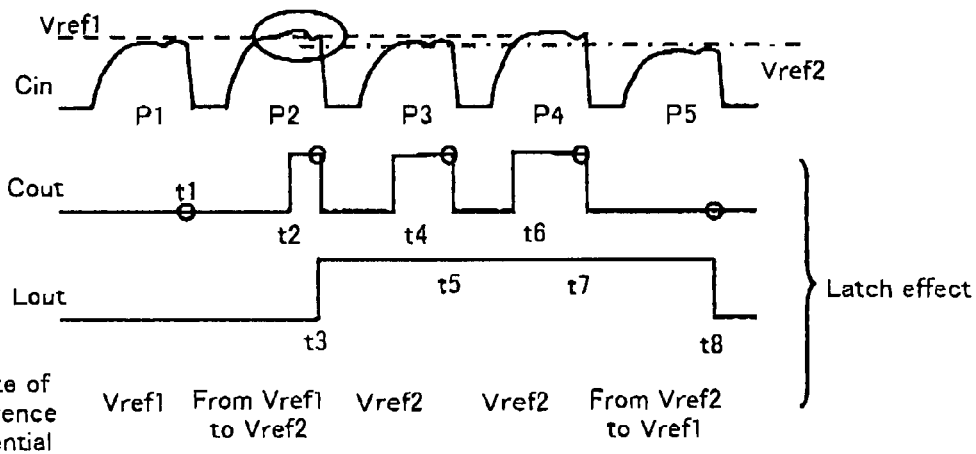
FIG. 16 is a waveform diagram showing an operation of the circuit device according to Embodiment 5 of the present invention.
Figure 17:
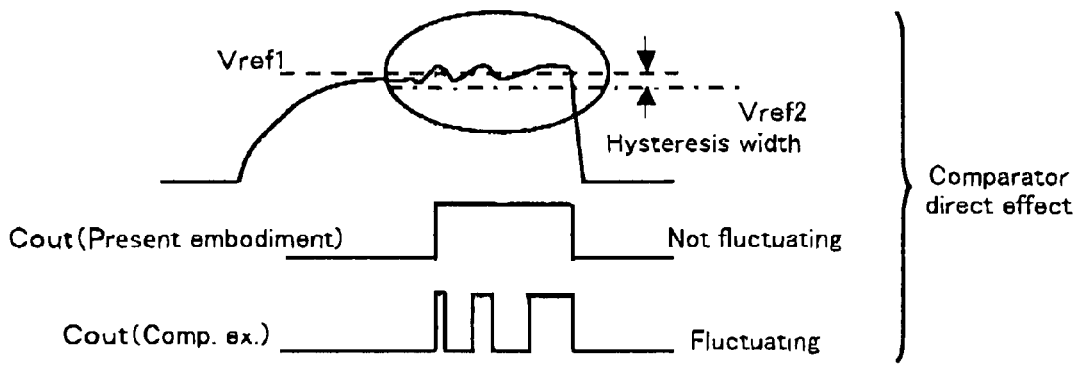
FIG. 17 is a waveform diagram showing an effect of the circuit device according to Embodiment 5 of the present invention.

FIG. 17 is an enlarged diagram showing the relationship between the transition of the input voltage $C_{in}$ and the output $C_{out}$ of the comparator 1 in the vicinity of the time t2 in FIG. 16. It should be noted that FIG. 17, for comparison, also shows an output $C_{out}$ of the comparator 1 in the case where the reference voltage $V_{ref}$ of the comparator 1 is maintained at $V_{ref1}$ at the time t2. As seen in FIG. 17, in the circuit device according to the present embodiment, the reference voltage $V_{ref}$ is switched from $V_{ref1}$ to $V_{ref2}$ at the time t2, which allows the output $C_{out}$ of the comparator 1 to avoid fluctuations. Thus, the circuit device obtains a stable output. On the other hand, as shown in the lowest part of FIG. 7 for comparison, if the reference voltage setting circuit 20 maintains the reference voltage $V_{ref}$ of the comparator 1 at $V_{ref1}$ at the time t2, fluctuations of the input voltage $C_{in}$ in the vicinity of $V_{ref1}$ result in fluctuations of the output $C_{out}$ of the comparator 1.

In FIG. 16, since the peak value of the input voltage $C_{in}$ in the third pulse P3 thereof exceeds the reference voltage $V_{ref2}$ at a time t4, the output $C_{out}$ of the comparator 1 is switched from LOW to HIGH at the time t4. Therefore, the output $L_{out}$ of the latch circuit 4 is maintained at HIGH at a time t5. It should be noted that since the output of the OR circuit 5 also is maintained at HIGH during this period, the switch 21 of the reference voltage setting circuit 20 is maintained in an OFF state while the switch 22 thereof is maintained in an ON state, whereby the reference voltage $V_{ref}$ of the comparator 1 is maintained at $V_{ref2}$.

Since the peak value of the input voltage $C_{in}$ in the fourth pulse P4 thereof exceeds the reference voltage $V_{ref2}$ at a time t6, the output $C_{out}$ of the comparator 1 is switched from LOW to HIGH at the time t6. Therefore, the output $L_{out}$ of the latch circuit 4 is maintained at HIGH at a time t7. It should be noted that since the output of the OR circuit 5 also is maintained at HIGH during this period, the switch 21 of the reference voltage setting circuit 20 is maintained in an OFF state while the switch 22 thereof is maintained in an ON state, whereby the reference voltage $V_{ref}$ of the comparator 1 is maintained at $V_{ref2}$.

Since the peak value of the input voltage $C_{in}$ in the fifth pulse P5 does not exceed the reference voltage $V_{ref2}$, the output $C_{out}$ of the comparator 1 remains LOW. Therefore, the output $L_{out}$ of the latch circuit 4 is switched from HIGH to LOW at a time t8. This causes the output of the OR circuit 5 to become LOW, whereby the switch 21 of the reference voltage setting circuit 20 is turned ON while the switch 22 thereof is turned OFF. As a result, the reference voltage $V_{ref}$ of the comparator 1 is switched from $V_{ref2}$ to $V_{ref1}$. As described above, the circuit device according to the present embodiment, configured so as to carry out a sampling operation and a comparing operation a plurality of times sequentially, makes it possible to stabilize an output ($L_{out}$) in both of the following cases: the case where the input voltage $C_{in}$ fluctuates in the vicinity of the reference voltage; and the case where the input voltage $V_{in}$ temporarily fluctuates.

It should be noted that the configuration including the OR circuit 5 is described as an exemplary configuration of the present embodiment, but the configuration may be modified so that the OR circuit 5 is omitted and only either one of the output $C_{out}$ of the comparator 1 or the output $L_{out}$ of the latch circuit 4 is fed back to the reference voltage setting circuit 20 so as to control the ON/OFF of the switches 21 and 22.

Embodiment 6

The following is a description of a circuit device according to Embodiment 6 of the present invention. It should be noted that members having the same functions as those of the above-described embodiments are designated with the same reference numerals as those in the above-described embodiments, and detail descriptions of the same are omitted herein.

Figure 18:
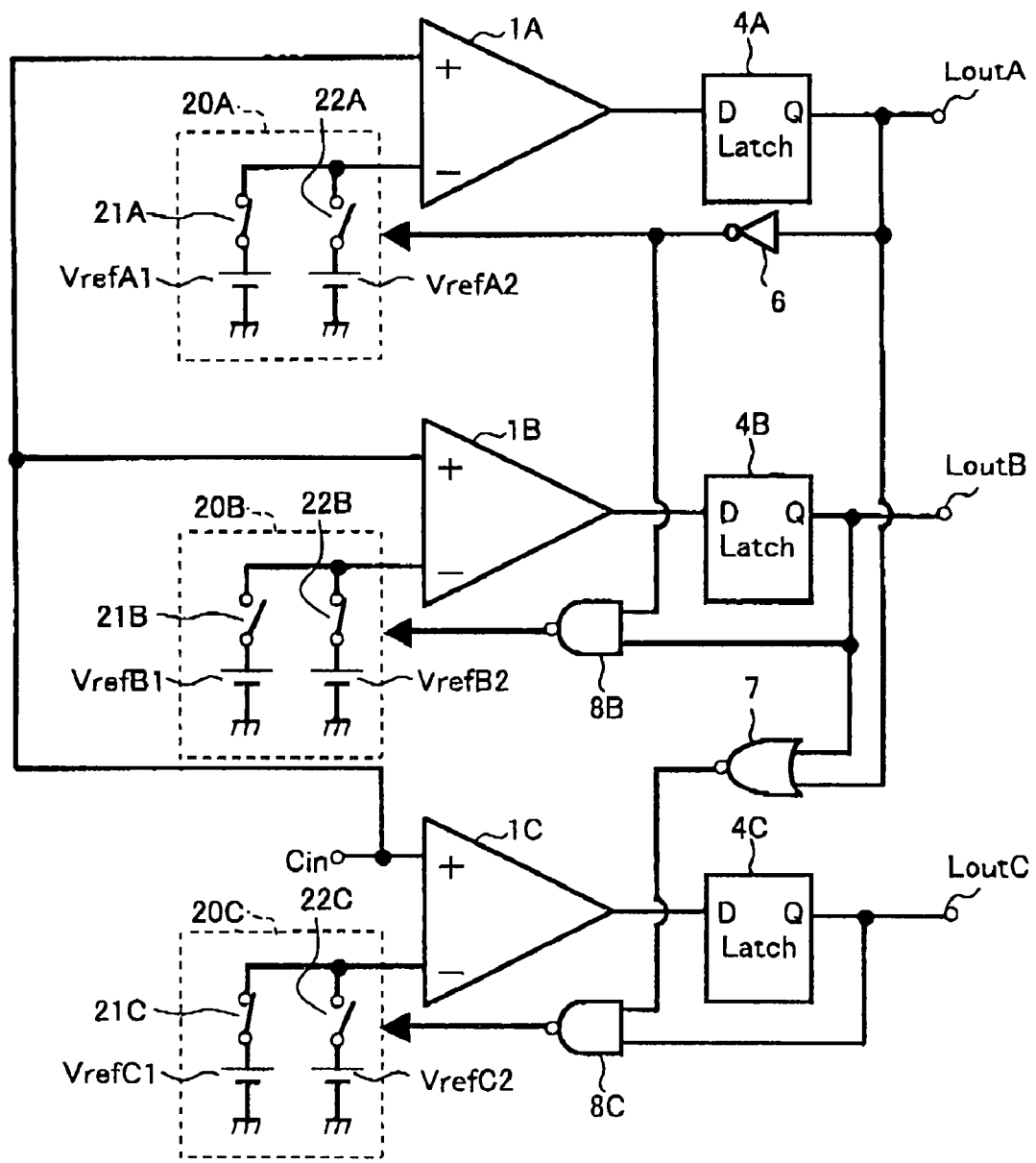
FIG. 18 is a circuit diagram showing a configuration of a circuit device according to Embodiment 6 of the present invention.

FIG. 18 is a circuit diagram showing a part of a configuration of a circuit device according to the present embodiment. As shown in FIG. 18, the circuit device according to the present embodiment includes three sets of a comparator 1, a reference voltage setting circuit 20, and a latch circuit 4; a NOT circuit 6; a NOR circuit 7; and NAND circuits 8B and 8C.

According to the configuration shown in FIG. 18, the input voltage $C_{in}$ is fed to each of the comparators 1A, 1B, and 1C. To the comparators 1A, 1B, and 1C, reference voltages $V_{refA}$, $V_{refB}$, and $V_{refC}$, which are different from one another, are fed, respectively, and are compared with the input voltage $C_{in}$, so that comparison results ($C_{outA}$, $C_{outB}$, and $C_{outC}$), HIGH or LOW, are fed to the latch circuits 4A, 4B, and 4C, respectively. It should be noted that the outputs of this circuit device are respective outputs $L_{outA}$, $L_{outB}$, and $L_{outC}$ from the latch circuits 4A, 4B, and 4C.

The output $L_{outA}$ of the latch circuit 4A is fed to the NOT circuit 6 and the NOR circuit 7. The output $L_{outB}$ of the latch circuit 4B is fed to the NAND circuit 8B and the NOR circuit 7. The output $L_{outC}$ of the latch circuit 4C is fed to the NAND circuit 8C. An output of the NOT circuit 6 is fed to the reference voltage setting circuit 20A and the NAND circuit 8B. An output of the NAND circuit 8B is fed to the reference voltage setting circuit 20B. An output of the NOR circuit 7 is fed to the NAND circuit 8C. An output of the NAND circuit 8C is fed to the reference voltage setting circuit 20C.

Figure 19:
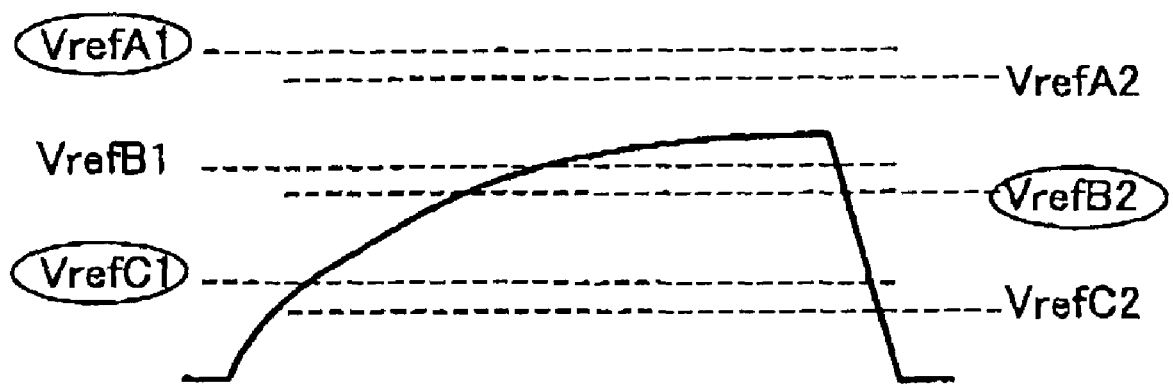
FIG. 19 is a waveform diagram showing an operation of the circuit device according to Embodiment 6 of the present invention.

When an input voltage $C_{in}$ having a waveform as shown in FIG. 19 is fed to the circuit device according to the present embodiment having the above-described configuration, the output of the NOT circuit 6 becomes HIGH, the output of the NAND circuit 8B becomes LOW, and the output of the NAND circuit 8C becomes HIGH. This causes the switches denoted by "21" (i.e., switches 21A, 21C) of the reference voltage setting circuits 20A and 20C to be turned ON, whereby the reference voltages $V_{refA1}$ and $V_{refC1}$ are fed to the comparators 1A and 1C, respectively. On the other hand, the switch denoted by "22" (i.e., switch 22B) of the reference voltage setting circuit 20B is turned ON, whereby the reference voltage $V_{refB2}$ is fed to the comparator 1B. Therefore, even if the input voltage $C_{in}$ fluctuates in the vicinity of the reference voltage $V_{refB1}$ due to influences of noises or the like, a stable output can be obtained. Besides, even in the case where a next input is processed based on a reference other than the foregoing set of reference voltages $V_{refB1}$, that is, based on either $V_{refA1}$ or $V_{refC1}$, an intended comparing operation with respect to an appropriate reference is enabled.

Figure 20:
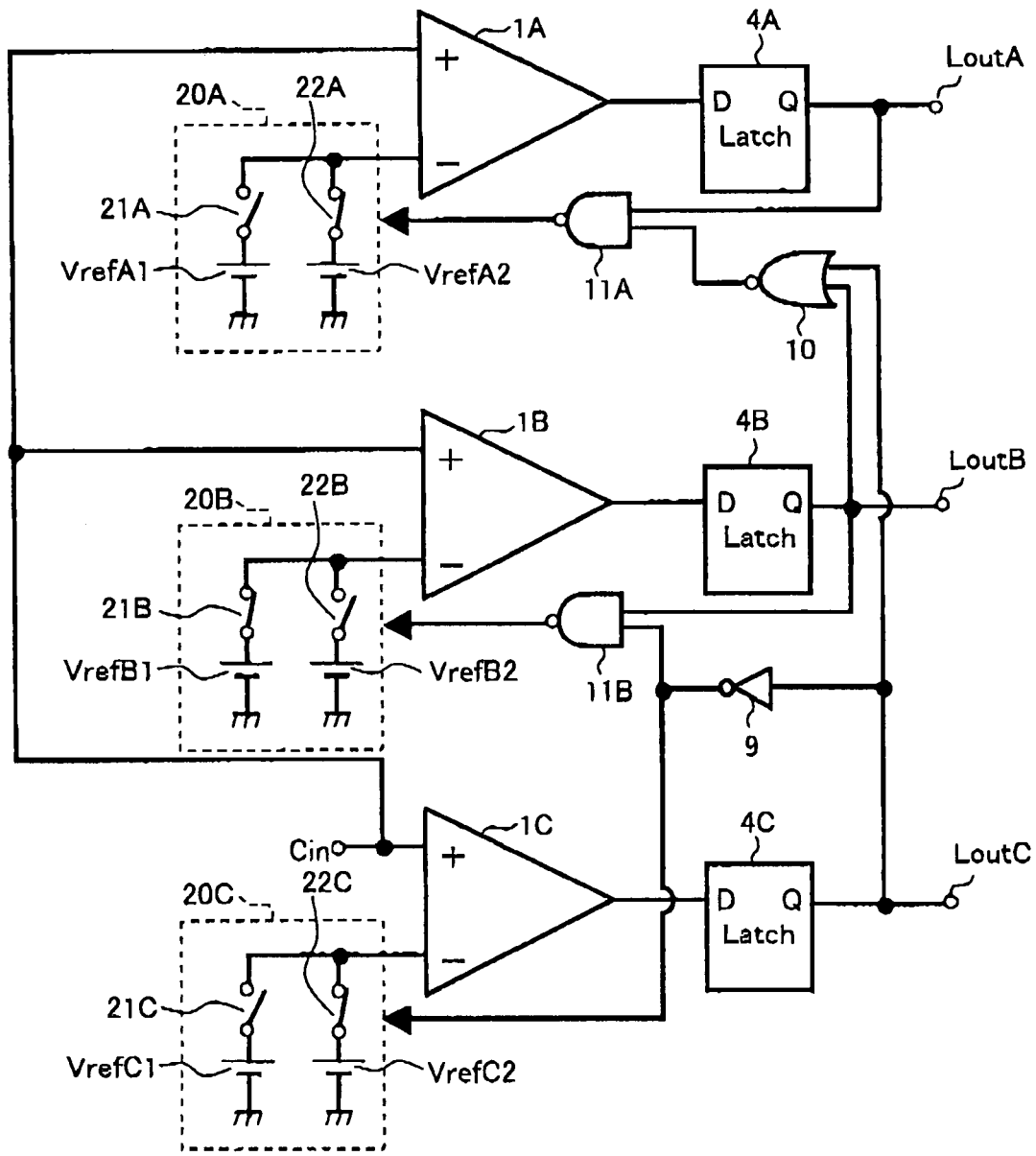
FIG. 20 is a circuit diagram showing another exemplary configuration of the circuit device according to Embodiment 6 of the present invention.

FIG. 20 is a circuit diagram showing another part of the circuit device according to the present embodiment. In other words, the circuit device according to the present embodiment has a configuration including both of the part shown in FIG. 18 and the part shown in FIG. 20. However, the comparators 1, the reference voltage setting circuits 20, the latch circuit 4, input/output terminals and the like are shown in FIGS. 18 and 20 duplicately.

As shown in FIG. 20, the circuit device according to the present embodiment includes a NOT circuit 9, a NOR circuit 10, and NAND circuits 11A and 11B, in addition to the three sets of the comparator 1, the reference voltage setting circuit 20, and the latch circuit 4.

An output $L_{outC}$ of the latch circuit 4C is fed to the NOT circuit 9 and the NOR circuit 10. An output $L_{outB}$ of the latch circuit 4B is fed to the NAND circuit 11B and the NOR circuit 10. An output $L_{outA}$ of the latch circuit 4A is fed to the NAND circuit 11A. An output of the NOT circuit 9 is fed to the reference voltage setting circuit 20C and the NAND circuit 11B. An output of the NAND circuit 11B is fed to the reference voltage setting circuit 20B. An output of the NOR circuit 10 is fed to the NAND circuit 11A. An output of the NAND circuit 11A is fed to the reference voltage setting circuit 20A.

Figure 21:
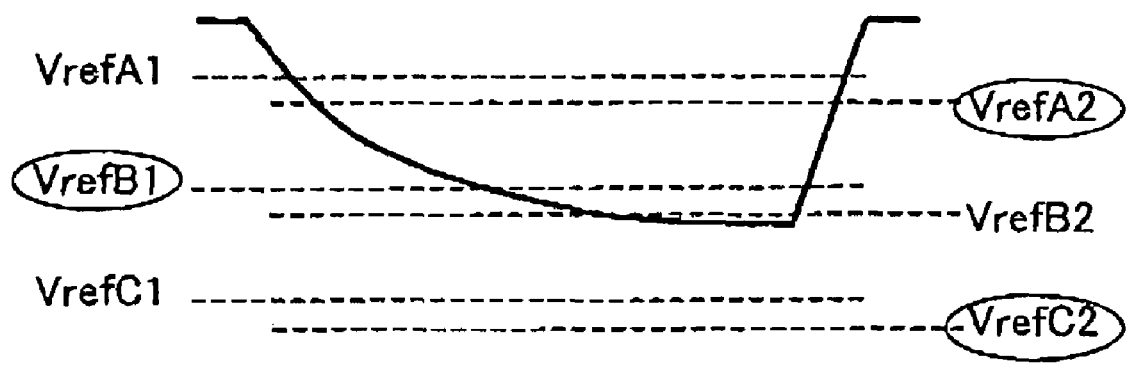
FIG. 21 is a waveform diagram showing an operation of the circuit device according to Embodiment 6 of the present invention.

When an input voltage $C_{in}$ having a waveform as shown in FIG. 21 is fed to the circuit device of the present embodiment having the above-described configuration, the output of the NOT circuit 9 becomes HIGH, the output of the NAND circuit 11B becomes LOW, and the output of the NAND circuit 11A becomes HIGH. This causes the switches denoted by "22" (i.e., switches 22A, 22C) of the reference voltage setting circuits 20A and 20C to be turned ON, whereby the reference voltages $V_{refA2}$ and $V_{refC2}$ are fed to the comparators 1A and 1C, respectively. On the other hand, the switch denoted by "21" (i.e., switch 21B) of the reference voltage setting circuit 20B is turned ON, whereby the reference voltage $V_{refB1}$ is fed to the comparator 1B. Therefore, even if the input voltage $C_{in}$ fluctuates in the vicinity of the reference voltage $V_{refB2}$ due to influences of noises or the like, a stable output can be obtained. Besides, even in the case where a next input is processed based on a reference other than the foregoing set of reference voltage levels $V_{refB2}$, that is, based on either $V_{refA2}$ or $V_{refC2}$, an intended comparing operation with respect to an appropriate reference is enabled.

Embodiment 7

The following is a description of a circuit device according to Embodiment 7 of the present invention. It should be noted that members having the same functions as those of the above-described embodiments are designated with the same reference numerals as those in the above-described embodiments, and detail descriptions of the same are omitted herein.

A circuit device according to the present embodiment has a configuration like that shown in FIG. 5 according to Embodiment 1, or those according to Embodiments 2 to 6, having a plurality of sets of the comparator 1 and the reference voltage setting circuit 20, and is characterized in a method for setting a reference voltage in the case where a sampling operation and a comparing operation are carried out a plurality of times sequentially with respect to an input voltage $C_{in}$.

Figure 22:
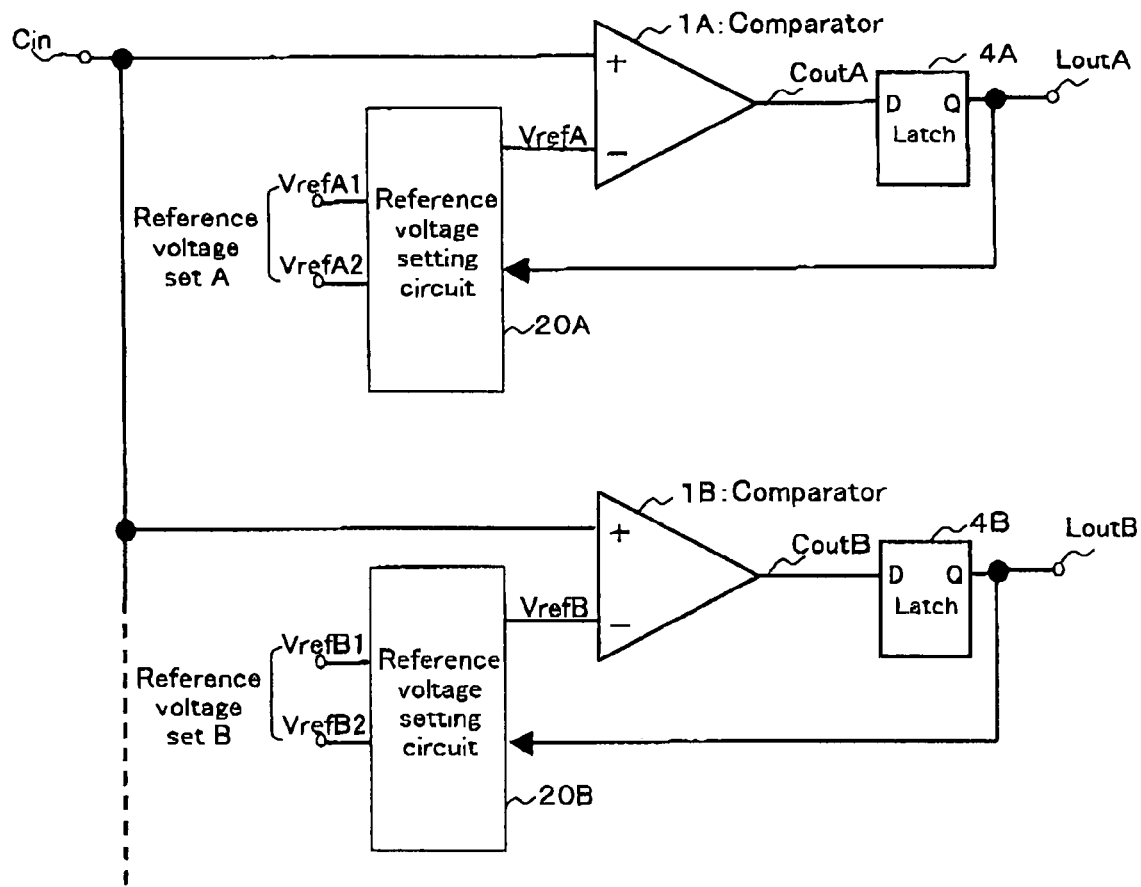
FIG. 22 is a circuit diagram showing a configuration of a circuit device according to Embodiment 7 of the present invention.

Thus, the circuit device according to the present embodiment has a configuration obtained by modifying the configuration shown in FIG. 5 by adding latch circuits 4A, 4B, . . . , as shown in FIG. 22. In the configuration of FIG. 22, an input voltage $C_{in}$ is fed to each of the comparators 1A, 1B, . . . . To the comparators 1A, 1B, . . . , reference voltages $V_{refA}$, $V_{refB}$, . . . , which are different from one another, are fed, respectively, and are compared with the input voltage $C_{in}$, so that comparison results ($C_{outA}$, $C_{outB}$, . . . ), HIGH or LOW, are fed out. The comparison results $C_{outA}$, $C_{outB}$, . . . are taken in the latch circuits 4A, 4B, . . . , respectively, and are retained therein for a certain period of time. The latch circuits 4A, 4B, . . . feed out output signals $L_{outA}$, $L_{outB}$ . . . according to the $C_{outA}$, $C_{outB}$ . . . taken therein, respectively. Thus, the magnitude of the input voltage $C_{in}$ can be determined to be one of a plurality of degrees based on HIGH/LOW of the foregoing outputs.

The output signals $L_{outA}$, $L_{outB}$ . . . are fed to the reference voltage setting circuits 20A, 20B . . . also. The reference voltage setting circuit 20A selects either $V_{refA1}$ or $V_{refA2}$ according to the transition of the output of $L_{outA}$ of the latch circuit 4A, and sets the selected one as the reference voltage $V_{refA}$. Likewise, the reference voltage setting circuit 20B selects either $V_{refB1}$ or $V_{refB2}$ according to the transition of the output $L_{outB}$ of the latch circuit 4B, and sets the selected one as the reference voltage $V_{refB}$. Respective potentials of $V_{refA1}$, $V_{refA2}$, $V_{refB1}$, $V_{refB2}$ . . . are set so as to satisfy $V_{refA1} > V_{refA2} > V_{refB1} > V_{refB2}$ . . . .

Figure 23:
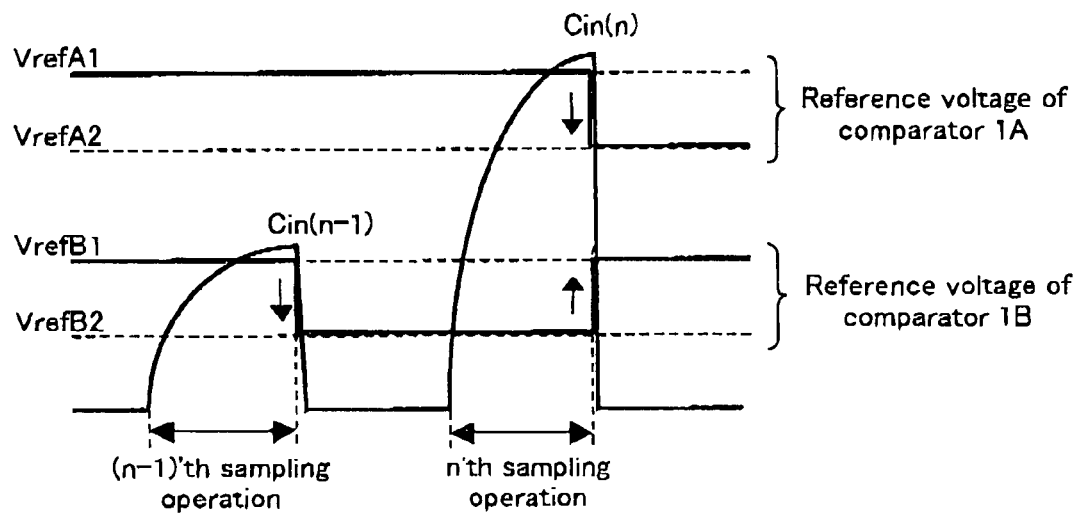
FIG. 23 is a waveform diagram showing an operation of the circuit device according to Embodiment 7 of the present invention.

An exemplary case in which the peak voltages of the input voltage $C_{in}$ at respective determining operations are in a rising transition from one determining operation to a next one and the input voltage $C_{10}$ is in a rising transition during each sampling period is shown in FIG. 23. In FIG. 23, the peak value of the input voltage $C_{in}$ at the n'th determining operation is higher than the peak voltage thereof at the (n−1)'th determining operation. Here, it is assumed that the reference voltages $V_{refA1}$, $V_{refA2}$, $V_{refB1}$, and $V_{refB2}$ shown in FIG. 23 satisfy the relationship of $V_{refA1} > V_{refA2} > V_{refB1} > V_{refB2}$, and the reference voltages of the comparators 1A and 1B initially are set to $V_{refA1}$ and $V_{refR1}$, respectively.

In this state, at the (n−1)'th determining operation, the output $C_{outB}$ of the comparator 1B becomes HIGH, and the reference voltage setting circuit 20B switches the reference voltage of the comparator 1B to $V_{refB2}$. It should be noted that a sampling period ends when the value of the input voltage $C_{in}$ reaches a peak, and a determination result at that time is latched so that a reference voltage is selected based on the foregoing information. Therefore, the falling of the input voltage $C_{in}$ after the sampling period ends does not affect the switching of the reference voltage of the comparator 1B.

Thereafter, at the n'th determining operation, the peak value of the input voltage $C_{in}$ goes beyond $V_{refA2}$ and further exceeds $V_{refA1}$, whereby the output $C_{outA}$ of the comparator 1A becomes HIGH. Then, the reference voltage setting circuit 20A switches the reference voltage of the comparator 1A to $V_{refA2}$. At this point of time, as described above, the reference voltage of the comparator 1B has been switched to $V_{refB2}$ by the reference voltage setting circuit 20B at the previous determining operation. In the circuit device according to the present embodiment, however, the reference voltage of the comparator 1B is reset from $V_{refB2}$ to $V_{refB1}$ when the reference voltage of the comparator 1A is switched to $V_{refA2}$ in response to the determination result of the n'th determining operation.

As described above, with the circuit device according to the present embodiment, the following effect can be achieved: when a sampling operation and a comparing-determining operation are carried out with respect to an input voltage a plurality of times sequentially, if the peak voltages of the input voltage at respective determining operations are in a rising transition from one determining operation to a next one, the reference voltage of the comparator is switched according to the latest determination result, whereby the setting of the reference voltage according to the latest fluctuations of the input voltage is enabled at all times. Besides, in the case where the reference voltage equivalent to the input voltage at the previous determining operation is different from the reference voltage at the current determining operation, the reference voltage set at the previous determining operation is reset to the initial state. By so doing, at the next determining operation using this reference voltage, the normal hysteresis operation is enabled. However, when a hysteresis width can be sufficiently ignorable with respect to a sensing data range, the resetting of the reference voltage at the previous determining operation to the initial state may be omitted.

Figure 24:
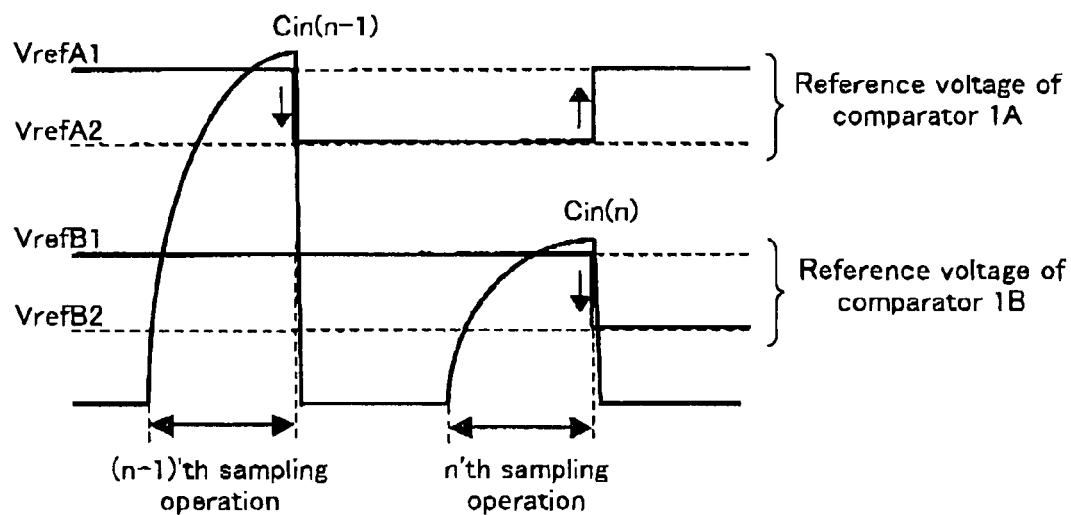
FIG. 24 is a waveform diagram showing an exemplary operation of the circuit device according to Embodiment 7 of the present invention.

Next, an exemplary case in which the peak voltages of the input voltage $C_{in}$ at respective determining operations are in a falling transition from one determining operation to a next one and the input voltage $C_{in}$ is in a rising transition during each sampling period is shown in FIG. 24. In FIG. 24, the peak value of the input voltage $C_{in}$ at the n'th determining operation is lower than the peak voltage thereof at the (n−1)'th determining operation. Here, it is assumed that the reference voltages $V_{refA1}$, $V_{refA2}$, $V_{refB1}$, and $V_{refB2}$ shown in FIG. 24 satisfy the relationship of $V_{refA1} > V_{refA2} > V_{refB1} > V_{refB2}$, and the reference voltages of the comparators 1A and 1B initially are set to $V_{refA1}$ and $V_{refB1}$, respectively. It should be noted that this setting applies to the case shown in FIG. 25.

In this state, at the (n−1)'th determining operation, the outputs $C_{outA}$ and $C_{outB}$ of the comparators 1A and 1B become HIGH, and the reference voltage setting circuit 20A switches the reference voltage of the comparator 1A to $V_{refA2}$.

In the circuit device according to the present embodiment, the reference voltage side of the comparator 1A is switched according to the result of the (n−1)'th determining operation, whereby the reference voltage of the comparator 1B is maintained at $V_{refB1}$. It should be noted that the sampling period ends when the value of the input voltage $C_{in}$ reaches a peak, and a determination result at that time is latched so that a reference voltage is selected based on the foregoing information. Therefore, the falling of the input voltage $C_{in}$ after the sampling period ends does not affect the switching of the reference voltages of the comparators 1A and 1B.

Thereafter, at the n'th determining operation, if the peak value of the input voltage $C_{in}$ exceeds $V_{refB1}$ as the reference voltage of the comparator 1B though not reaching $V_{refA2}$ as the reference voltage of the comparator 1A as shown in FIG. 24, the output $C_{outB}$ of the comparator 1B becomes HIGH. Then, the reference voltage setting circuit 20B switches the reference voltage of the comparator 1B to $V_{refB2}$, while the reference voltage of the comparator 1A is brought back to $V_{refA1}$ from $V_{refA2}$.

As described above, with the circuit device according to the present embodiment, the following effect can be achieved: when a sampling operation and a comparing-determining operation are carried out with respect to an input voltage a plurality of times sequentially, if the peak voltages of the input voltage at respective determining operations are in a falling transition from one determining operation to a next one, the reference voltage of the comparator is switched according to the latest determination result, whereby the setting of the reference voltage according to the latest fluctuations of the input voltage is enabled at all times. Besides, the reference voltage equivalent to the input voltage at the previous determining operation is reset to the initial state. By so doing, at the next determining operation using the foregoing reference voltage, the normal hysteresis operation is enabled. However, when a hysteresis width can be sufficiently ignorable with respect to a sensing data range, the resetting of the reference voltage at the previous determining operation to the initial state may be omitted. In this case, the following operation is carried out.

At the (n−1)'th determining operation, the outputs $C_{outA}$ and $C_{outB}$ of the comparators 1A and 1B become HIGH, and the reference voltage setting circuit 20A switches the reference voltage of the comparator 1A is switched $V_{refA2}$. The reference voltage setting circuit 20B switches the reference voltage of the comparator 1B to $V_{refB2}$. It should be noted that the sampling period ends when the value of the input voltage $C_{in}$ reaches a peak, and a determination result at that time is latched so that a reference voltage is selected based on the foregoing information. Therefore, the falling of the input voltage $C_{in}$ after the sampling period ends does not affect the switching of the reference voltages of the comparators 1A and 1B.

Figure 25:
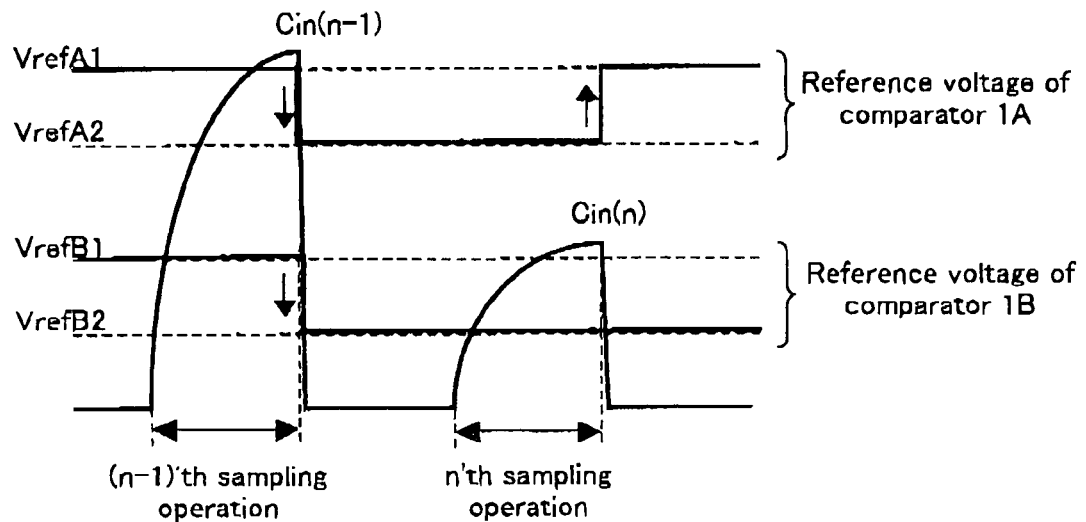
FIG. 25 is a waveform diagram showing another exemplary operation of the circuit device according to Embodiment 7 of the present invention.

Thereafter, at the n'th determining operation, if the peak value of the input voltage $C_{in}$ exceeds $V_{refB2}$ as the reference voltage of the comparator 1B though not reaching $V_{refA2}$ as the reference voltage of the comparator 1A as shown in FIG. 25, the output $C_{outB}$ of the comparator 1B becomes HIGH. In this case, the reference voltage setting circuit 20B maintains the reference voltage of the comparator 1B at $V_{refB2}$, while the reference voltage of the comparator 1A is brought back to $V_{refA1}$ from $V_{refA2}$.

On the other hand, at the n'th determining operation, if the peak value of the input voltage $C_{in}$ does not exceed $V_{refB2}$ as the reference voltage of the comparator 1B, the output $C_{outB}$ of the comparator 1B becomes LOW. In this case, the reference voltage setting circuit 20B switches the reference voltage $V_{refB2}$ of the comparator 1B to $V_{refB1}$, while the reference voltage of the comparator 1A is set to $V_{refA1}$.

Figure 26:
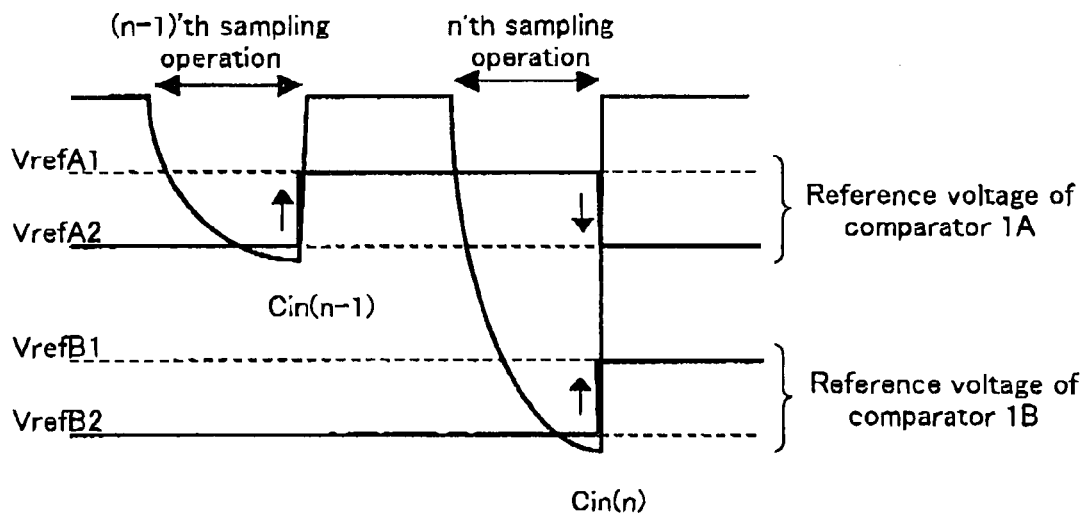
FIG. 26 is a waveform diagram showing an operation of the circuit device according to Embodiment 7 of the present invention.

Next, an exemplary case in which the peak voltages of the input voltage $C_{in}$ at respective determining operations are in a falling transition from one determining operation to a next one and the input voltage $C_{in}$ during each sampling period is in a falling transition is shown in FIG. 26. In FIG. 26, the peak value $C_{in(n)}$ of the input voltage at the n'th determining operation is lower than the peak value $C_{in(n−1)}$ thereof at the (n−1)'th determining operation. Here, it is assumed that the reference voltages $V_{refA1}$, $V_{refA2}$, $V_{refB1}$, and $V_{refB2}$ shown in FIG.

26 satisfy the relationship of $V_{refA1} > V_{refA2} > V_{refB1} > V_{refB2}$, and the reference voltages of the comparators 1A and 1B initially are set to $V_{refA2}$ and $V_{refB2}$, respectively.

In this state, at the (n−1)'th determining operation, the peak value of the input voltage $C_{in}$ falls to below $V_{refA2}$, and the output $C_{outA}$ of the comparator 1A becomes LOW. Then, the reference voltage setting circuit 20A switches the reference voltage of the comparator 1A to $V_{refA1}$. It should be noted that the sampling period ends when the value of the input voltage $C_{in}$ reaches a peak, and a determination result at that time is latched so that a reference voltage is selected based on the foregoing information. Therefore, the rising of the input voltage $C_{in}$ after the sampling period ends does not affect the switching of the reference voltage of the comparator 1A.

Thereafter, at the n'th determining operation, if the peak value of the input voltage $C_{in}$ falls to below $V_{refB2}$, the output $C_{outB}$ of the comparator 1B becomes LOW, and the reference voltage setting circuit 20B switches the reference voltage of the comparator 1B to $V_{refB1}$. At this point of time, as described above, the reference voltage of the comparator LA has been switched to $V_{refA1}$ by the reference voltage setting circuit 20A at the previous determining operation. In the circuit device according to the present embodiment, however, the reference voltage of the comparator 1A is brought from $V_{refA1}$ back to $V_{refA2}$ when the reference voltage of the comparator 1B is switched to $V_{refB1}$ according to the determination result of the n'th determining operation.

As described above, with the circuit device according to the present embodiment, the following effect can be achieved: when a sampling operation and a comparing-determining operation are carried out with respect to an input voltage a plurality of times sequentially, if the peak voltages of the input voltage at respective determining operations are in a falling transition from one determining operation to a next one, the reference voltage of the comparator is switched according to the latest determination result, whereby the setting of the reference voltage according to the latest fluctuations of the input voltage is enabled at all times. Besides, in the case where the reference voltage equivalent to the input voltage at the previous determining operation is different from the reference voltage at the current determining operation, the reference voltage set at the previous determining operation is reset to the initial state. By so doing, at the next determining operation using this reference voltage, the normal hysteresis operation is enabled. However, when a hysteresis width can be sufficiently ignorable with respect to a sensing data range, the resetting of the reference voltage at the previous determining operation to the initial state may be omitted.

Figure 27:
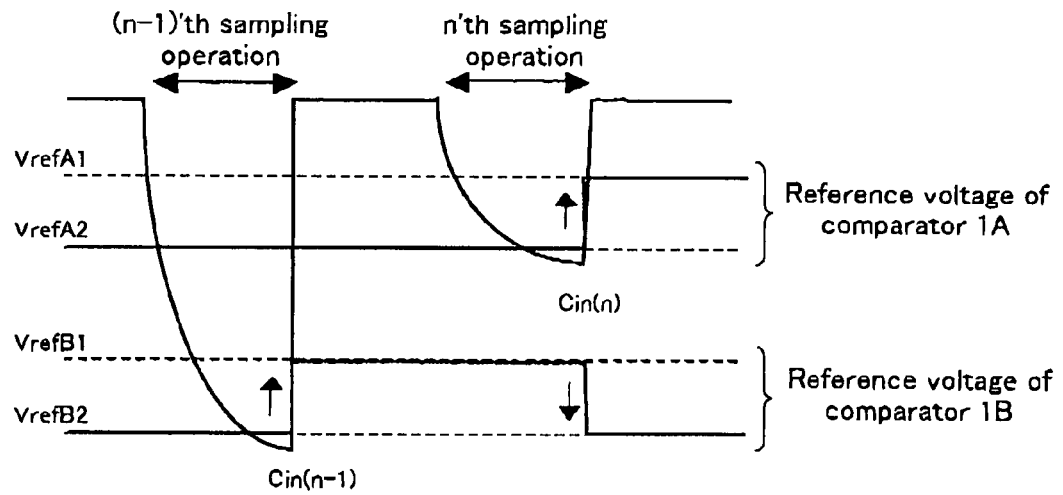
FIG. 27 is a waveform diagram showing still another exemplary operation of the circuit device according to Embodiment 7 of the present invention.

Next, an exemplary case in which the peak voltages of the input voltage $C_m$ at respective determining operations are in a rising transition from one determining operation to a next one and the input voltage $C_m$ during each sampling period is in a falling transition is shown in FIG. 27. In FIG. 27, the peak value of the input voltage $C_m$ at the n'th determining operation is higher than the peak voltage thereof at the (n−1)'th determining operation. Here, it is assumed that the reference voltages $V_{refA1}$, $V_{refA2}$, $V_{refB1}$ and $V_{refB2}$ shown in FIG. 27 satisfy the relationship of $V_{refA1} > V_{refA2} > V_{refB1} > V_{refB2}$, and the reference voltages of the comparators 1A and 1B initially are set to $V_{refA2}$ and $V_{refB2}$, respectively. It should be noted that this setting applies to the case shown in FIG. 28.

In this state, at the (n−1)'th determining operation, the peak value of the input voltage $C_{in}$ falls to below $V_{refB2}$, and both of the outputs $C_{outA}$ and $C_{outB}$ of the comparators 1A and 1B become LOW. Then, the reference voltage setting circuit 20B switches the reference voltage of the comparator 1B to $V_{refB1}$.

In the circuit device according to the present embodiment, the reference voltage of the comparator 1B is switched according to the determination result of the (n−1)'th determining operation, whereby the reference voltage of the comparator 1A is maintained at $V_{refA2}$. It should be noted that the sampling period ends when the value of the input voltage $C_{in}$ reaches a peak, and a determination result at that time is latched so that a reference voltage is selected based on the foregoing information. Therefore, the rising of the input voltage $C_{in}$ after the sampling period ends does not affect the switching of the reference voltages of the comparator 1A and 1B.

Thereafter, at the n'th determining operation, if the peak value of the input voltage $C_{in}$ does not fall to below $V_{refB1}$ as the reference voltage of the comparator 1B but falls to below $V_{refA2}$ as shown in FIG. 27, the output $C_{outA}$ of the comparator 1A becomes LOW. In this case, the reference voltage setting circuit 20A switches the reference voltage of the comparator 1A to $V_{refA1}$, while the reference voltage of the comparator 1B is brought back to $V_{refB2}$ from $V_{refB1}$.

As described above, with the circuit device according to the present embodiment, the following effect can be achieved: when a sampling operation and a comparing-determining operation are carried out with respect to an input voltage a plurality of times sequentially, if the peak voltages of the input voltage at respective determining operations are in a rising transition from one determining operation to a next one, the reference voltage of the comparator is switched according to the latest determination result, whereby the setting of the reference voltage according to the latest fluctuations of the input voltage is enabled at all times. Besides, in the case where the reference voltage equivalent to the input voltage at the previous determining operation is different from the reference voltage at the current determining operation, the reference voltage set at the previous determining operation is reset to the initial state. By so doing, at the next determining operation using this reference voltage, the normal hysteresis operation is enabled. However, when a hysteresis width can be sufficiently ignorable with respect to a sensing data range, the resetting of the reference voltage at the previous determining operation to the initial state may be omitted. The operation in this case is shown below.

At the (n−1)'th determining operation, the peak value of the input voltage $C_{in}$ falls to below $V_{refB2}$ and both of the outputs $C_{outA}$ and $C_{outB}$ of the comparators 1A and 1B become LOW. Then, the reference voltage setting circuit 20A switches the reference voltage of the comparator 1A to $V_{refA1}$, and the reference voltage setting circuit 20B switches the reference voltage of the comparator 1B to $V_{refB1}$. It should be noted that the sampling period ends when the value of the input voltage $C_{in}$ reaches a peak, and a determination result at that time is latched so that a reference voltage is selected based on the foregoing information. Therefore, the rising of the input voltage $C_{in}$ after the sampling period ends does not affect the switching of the reference voltages of the comparators 1A and 1B.

Figure 28:
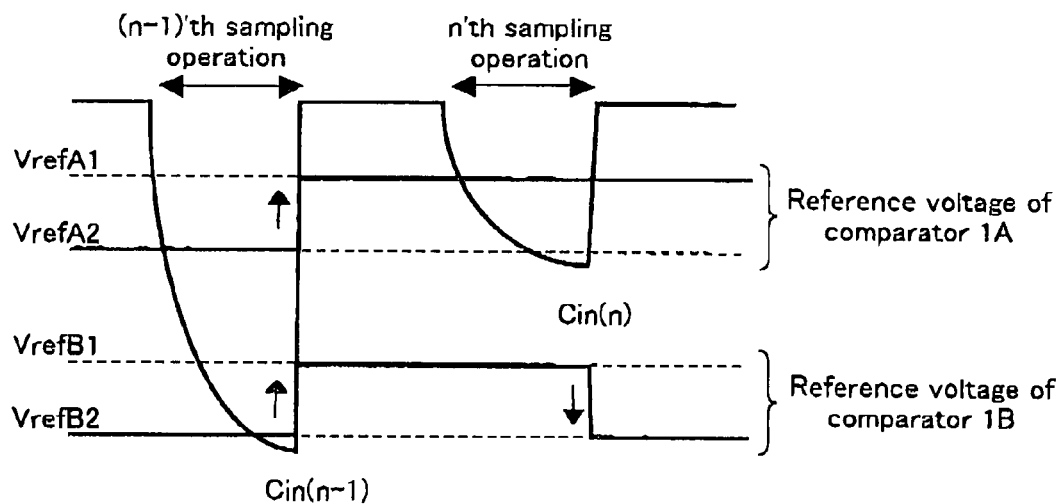
FIG. 28 is a waveform diagram showing still another exemplary operation of the circuit device according to Embodiment 7 of the present invention.

Thereafter, at the n'th determining operation, the peak value of the input voltage $C_{in}$ falls to below $V_{refA1}$ though not falling to below $V_{refB1}$ as the reference voltage of the comparator 1B as shown in FIG. 28, and the output $C_{outA}$ of the comparator 1A becomes LOW. In this case, the reference voltage setting circuit 20A maintains the reference voltage of the comparator 1A at $V_{refA1}$, while the reference voltage of the comparator 1B is brought back to $V_{refB2}$ from $V_{refB1}$.

On the other hand, when the peak value of the input voltage $C_{in}$ does not fall to below $V_{refA1}$ as the reference voltage of the comparator 1A, the output $C_{outA}$ of the comparator 1A becomes HIGH. In this case, the reference voltage setting circuit 20A switches the reference voltage of the comparator 1A from $V_{refA1}$ to $V_{refA2}$, while the reference voltage of the comparator 1B is set to $V_{refB2}$.

Embodiment 8

The following is a description of an embodiment of electronic equipment of the present invention. It should be noted that members having the same functions as those of the above-described embodiments are designated with the same reference numerals as those in the above-described embodiments, and detail descriptions of the same are omitted herein.

Figure 29:
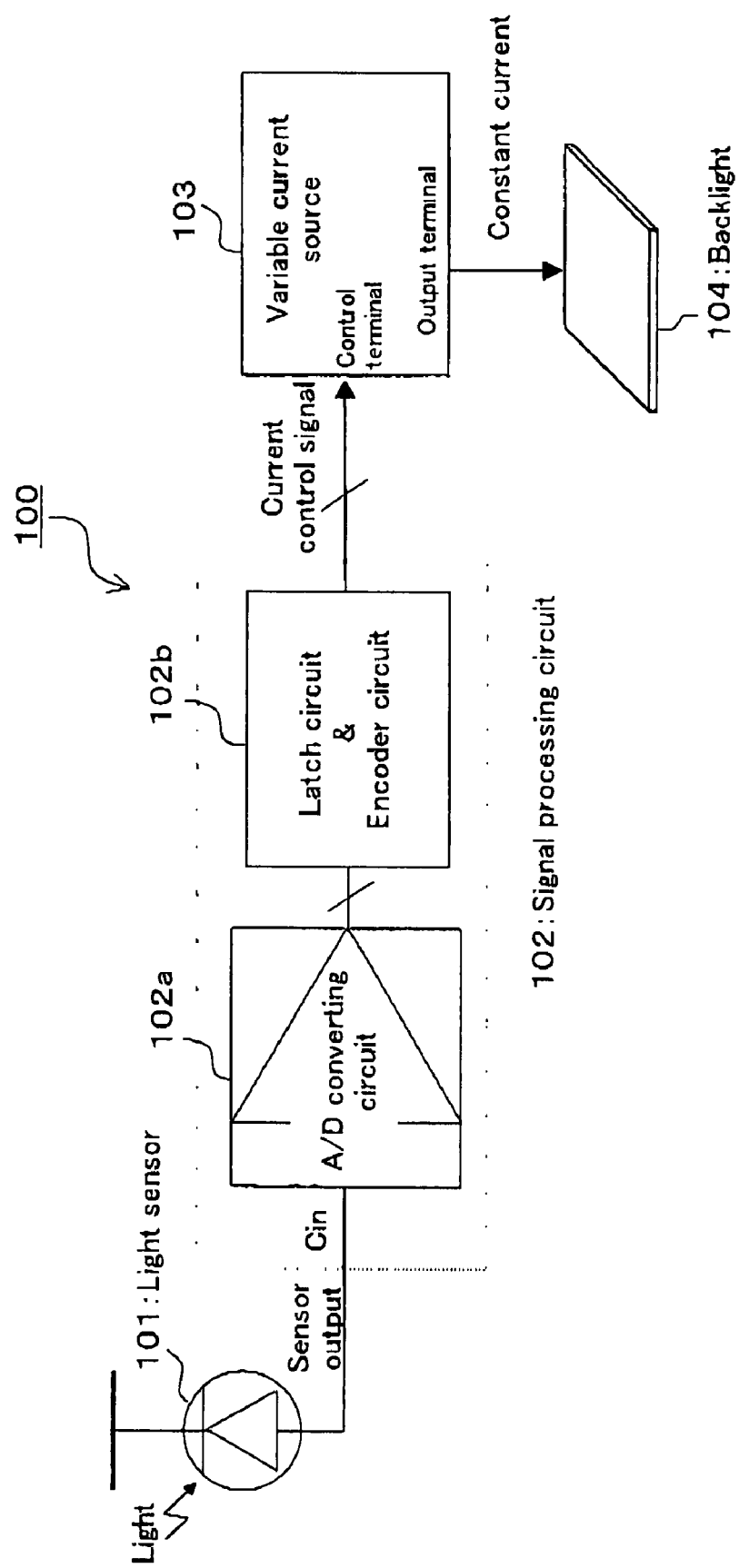
FIG. 29 is a circuit diagram showing a configuration of electronic equipment according to Embodiment 8 of the present invention.

First, electronic equipment according to an embodiment of the present invention is described in which the circuit device according to any one of Embodiments 1 to 7 is applied as a signal processing circuit for processing a sensor output. More specifically, the electronic equipment of the present embodiment is a backlight device capable of adjusting its lighting brightness according to the intensity of ambient light. As shown in FIG. 29, a backlight device 100 according to the present embodiment includes a light sensor 101, a signal processing circuit 102, a variable current source 103, a backlight 104, and the like. As the light sensor 101, a photodiode or the like is used.

In order to adjust the lighting brightness of the backlight 104 according to the intensity of the ambient light, the signal processing circuit 102 generates a current control signal according to an output of the light sensor 101, and feeds out the same to the variable current source 103. Therefore, the signal processing circuit 102 includes an A/D converting circuit 102a for generating digital data indicative of the intensity of the ambient light based on the output of the light sensor 101, and a latch-encoder circuit 102 for converting the signal generated by the A/D converting circuit 102a into a current control signal. As the A/D converting circuit 102a, the circuit device according to any one of Embodiments 1 to 7 described above is used. The variable current source 103 feeds a current according to the current control signal fed from the signal processing circuit 102 to the backlight 104, whereby the brightness of the backlight 104 can be adjusted in a stepwise manner according to the intensity of the ambient light.

For example, in the case where the circuit device shown in FIG. 1 is used as the A/D converting circuit 102a, the output of the light sensor 101 may be fed as an input voltage $C_{in}$ to the foregoing circuit device, and the result ($C_{out}$) of determination by the comparator 1 may be fed out as digital data, HIGH or LOW. By so doing, the following adjustment is possible- when the intensity of the ambient light is greater than a predetermined threshold value ($C_{out}$=HIGH), the brightness of the backlight 104 is increased; and when the intensity of the ambient light is smaller than a predetermined threshold value ($C_{out}$=LOW), the brightness of the backlight 104 is decreased.

Further, by using the circuit device according to any one of the above-described embodiments as the A/D converting circuit 102a, as described in the descriptions of the embodiments, a stable output $C_{out}$ can be obtained even if the input voltage $C_{in}$ fluctuates in the vicinity of the reference voltage due to influences of noises or the like. This makes it possible to prevent a phenomenon in which owing to influences of noises or the like, the backlight 104 is brightened or darkened though the intensity of the ambient light remains unchanged. Still further, since needless switching operations with respect to switches and the like can be avoided, the reduction of power consumption can be achieved.

It should be noted that it is possible to control the brightness of the backlight 104 at (N+1) grades by using, as the A/D converting circuit 102a, the circuit device including N sets of a comparator and a reference voltage setting circuit, etc., as shown in FIG. 5 in conjunction with Embodiment 1, and as described in the descriptions of Embodiments 2 to 7.

Figure 30:
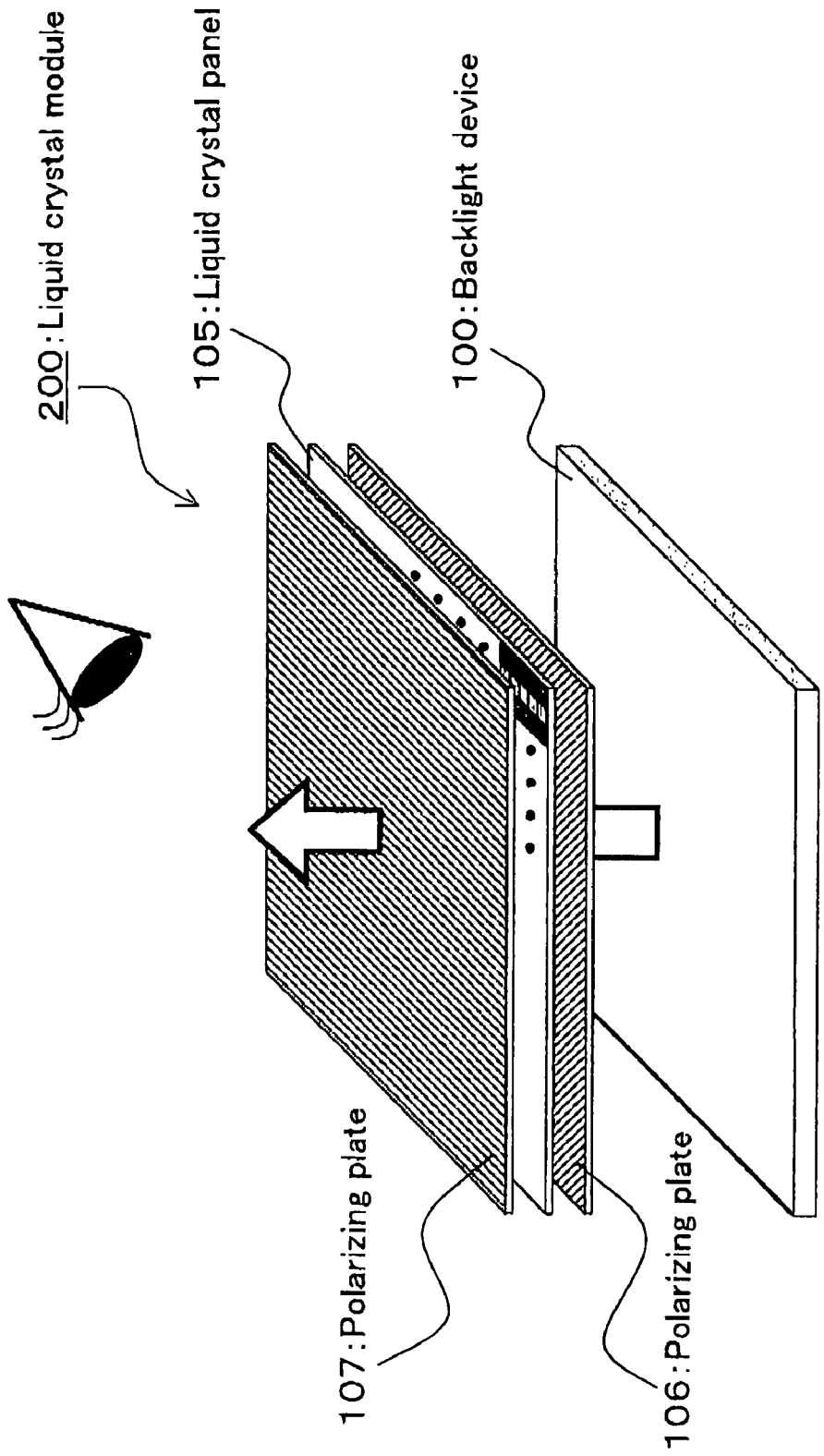
FIG. 30 is an exploded perspective view showing a configuration of the electronic equipment according to Embodiment 8 of the present invention.

It should be noted, as shown in FIG. 30, a liquid crystal module 200 in which the backlight device 100 according to the present embodiment is incorporated on a rear side of a liquid crystal panel 105 interposed between polarizing plates 106 and 107 is also an embodiment of the present invention. It should be noted that since the configuration of the liquid crystal module is known, only a schematic configuration is shown in FIG. 30 regarding the liquid crystal module 200, and the illustration of peripheral circuits including driving circuits and optical films of various types is omitted therein. The liquid crystal module 200 is applicable widely in cellular phones, PDAs, personal computers, etc.

As the present embodiment, an exemplary case in which the circuit device according to any one of the above-described embodiments is used as a signal processing circuit for a light sensor, but the type of the sensor element is not limited to the light sensor. For example, it is possible to use the circuit device in combination with, for example, a temperature sensor, a pressure sensor, and various sensor elements other than these.

Embodiment 9

The following is a description of another exemplary application of the circuit device of the present invention. It should be noted that members having the same functions as those of the above-described embodiments are designated with the same reference numerals as those in the above-described embodiments, and detail descriptions of the same are omitted herein.

Figure 31A:
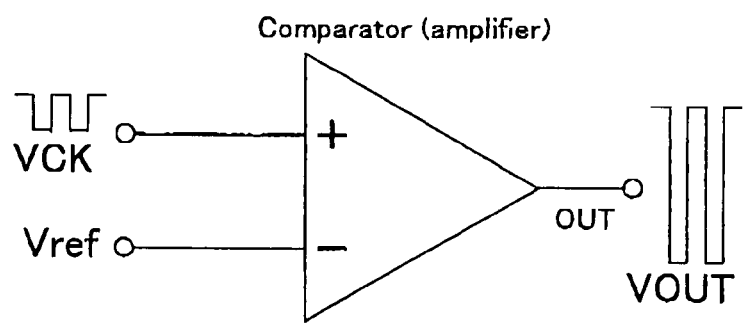
FIG. 31 (a) of FIG. 31 is a circuit diagram showing a configuration of a common level shifter, (b) of FIG. 31 is a waveform diagram showing an operation of the foregoing level shifter, and (c) of FIG. 31 is a waveform diagram showing an amplified voltage obtained.
Figure 31B:
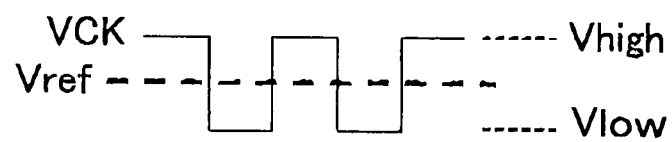
Figure 31C:
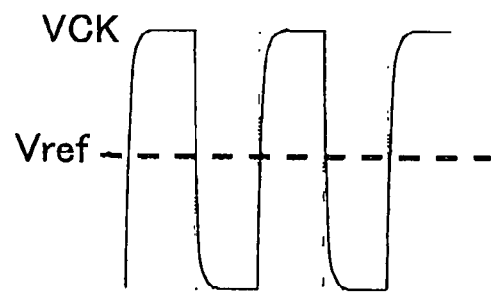

As the present embodiment, an exemplary case in which the circuit device according to any one of Embodiments 1 to 7 is applied to a level shifter is described. Referring to FIG. 31, an operation of a common level shifter is described below.

As shown in (a) of FIG. 31, the common level shifter feeds VCK and $V_{ref}$ to a comparator (amplifier), and amplifies VCK in the following manner: VCK is amplified on a higher voltage side according to a potential difference between the higher potential of the amplitude of VCK ($V_{high}$ shown in (b) of FIG. 31) and $V_{ref}$, and VCK is amplified on a lower voltage side according to a potential difference between the lower potential of the amplitude of VCK ($V_{low}$ shown in (b) of FIG. 31) and $V_{ref}$. As a result, an amplified voltage as shown in (c) of FIG. 31 is obtained as $V_{out}$.

For example, in a liquid crystal module in which an amorphous silicon TFT is used as a pixel driving element and $V_{low}$ of an IC logic voltage (VCK) is 0.0V while $V_{high}$ thereof is 3.3 V, the foregoing VCK has to be amplified so as to have an amplitude of −10.0 V to 10.0V so that a driving voltage $V_{out}$ for the foregoing TFT is obtained.

Figure 32A:
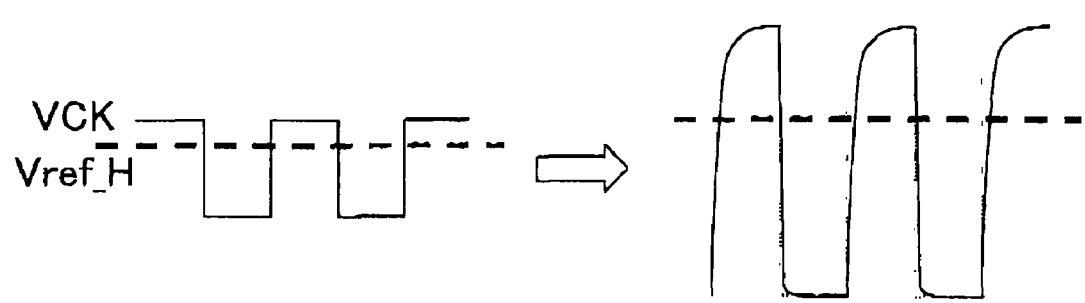
FIGS. 32 (a) and (b) of FIG. 32 are waveform diagrams showing operations of a circuit device according to Embodiment 9 of the present invention.
Figure 32B:
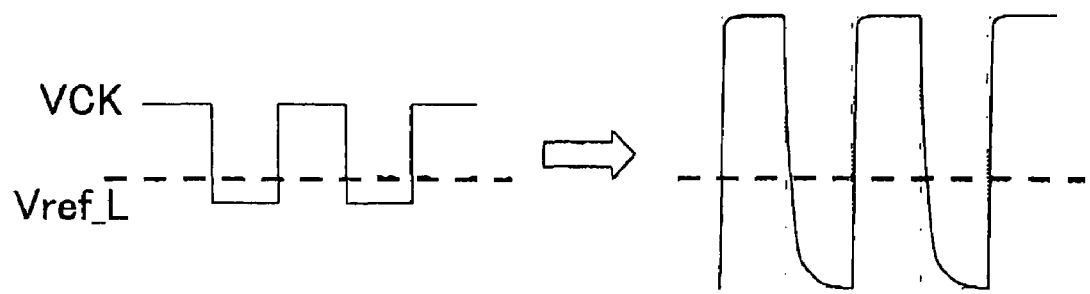

It should be noted that in a level shifter, the amplification speed depends on a difference between VCK and $V_{ref}$, and the amplification speed increases as the foregoing difference is greater. Therefore, to amplify VCK on the higher voltage side, the potential of $V_{ref}$ should be shifted to the lower voltage side so that the potential difference between the same and VCK is increased, whereby the rising of $V_{out}$ becomes abrupt, as shown in (b) of FIG. 32. On the other hand, to amplify VCK on the lower voltage side, $V_{ref}$ should be shifted to the higher voltage side so that the potential difference between the same and VCK is increased, whereby the falling of $V_{out}$ becomes abrupt, as shown in (a) of FIG. 32.

Figure 33A:
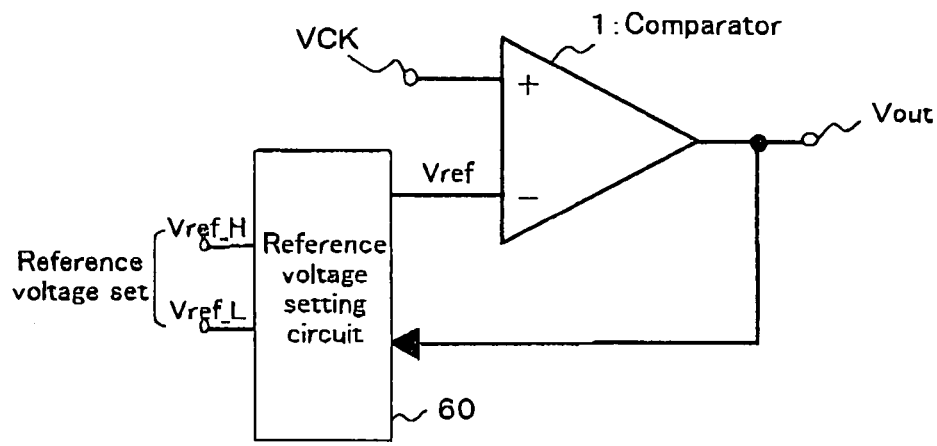
FIG. 33 (a) of FIG. 33 is a circuit diagram showing a configuration of a circuit device according to Embodiment 9 of the present invention, and (b) of FIG. 33 is a waveform diagram showing an operation of the foregoing circuit device.
Figure 33B:
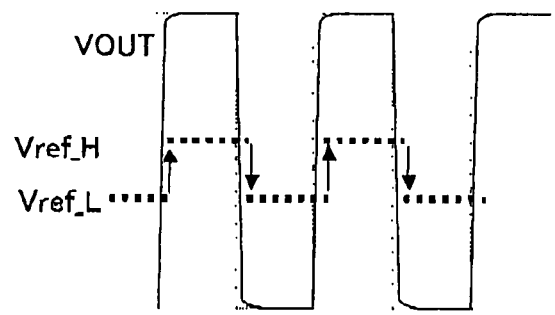
Figure 34:
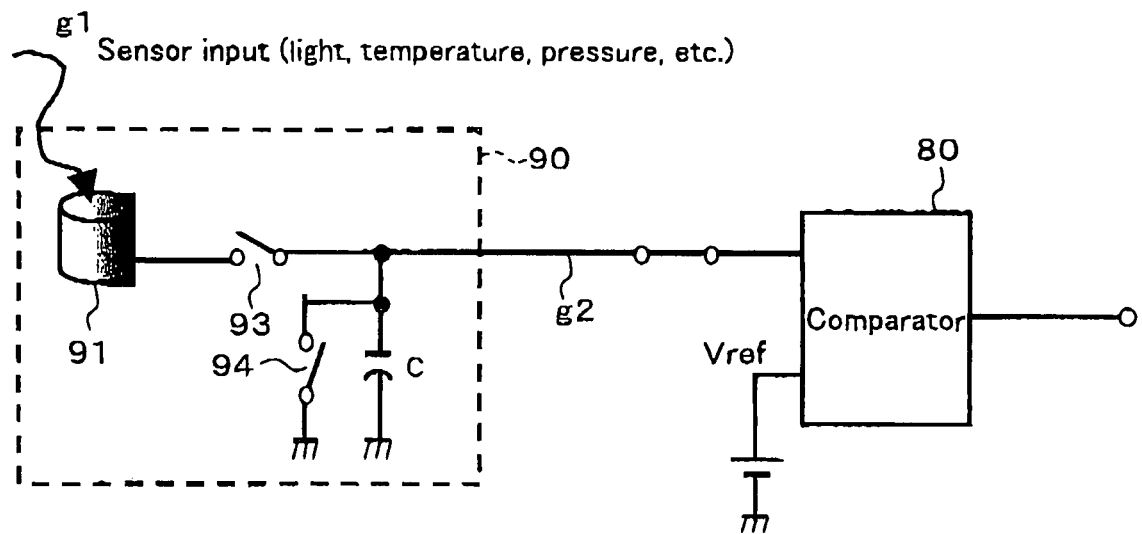
FIG. 34 is a block diagram showing a configuration of a conventional sensor circuit.
Figure 35:
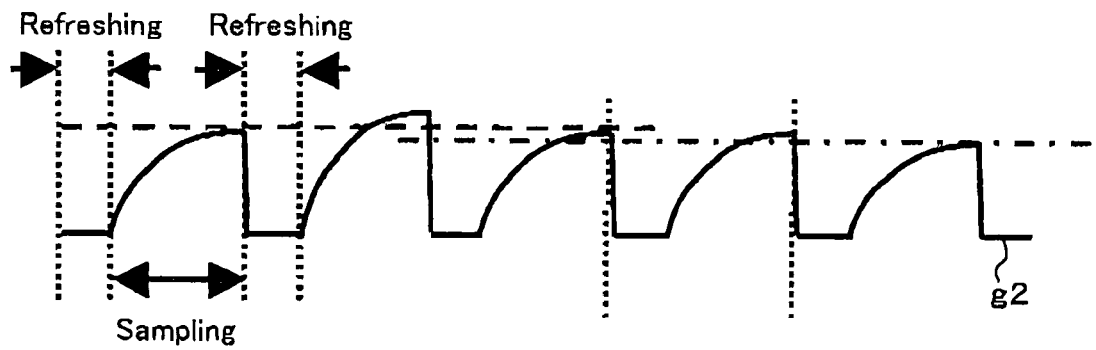
FIG. 35 is a waveform diagram explaining a sampling operation by the conventional sensor circuit.
Figure 36:
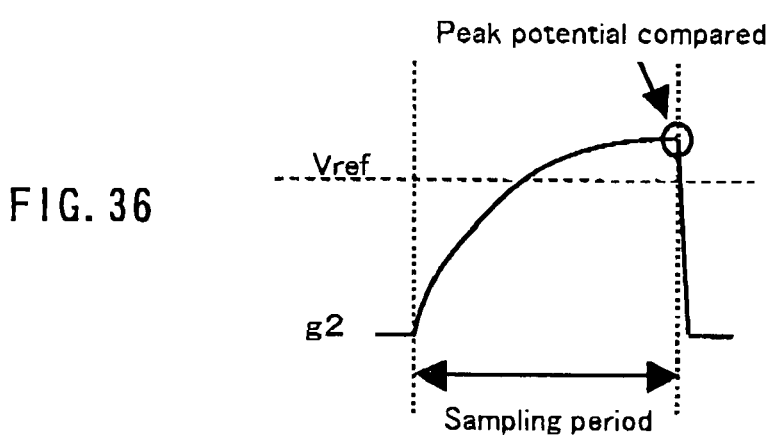
FIG. 36 is a waveform diagram explaining an exemplary comparing operation performed in the conventional sensor circuit.
Figure 37:
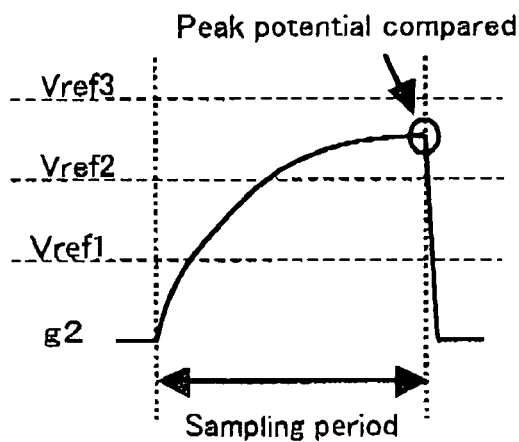
FIG. 37 is a waveform diagram explaining another exemplary comparing operation performed in the conventional sensor circuit.
Figure 38:
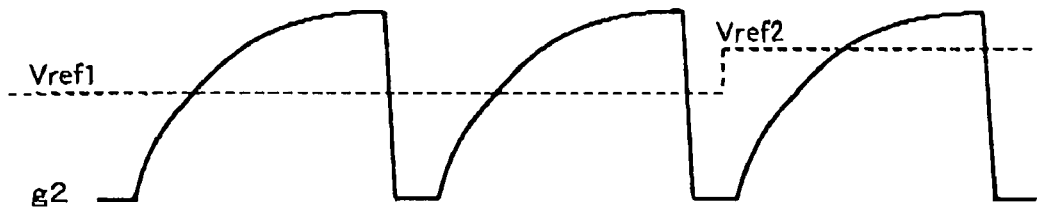
FIG. 38 is a waveform diagram explaining an operation of the conventional sensor circuit.
Figure 39:
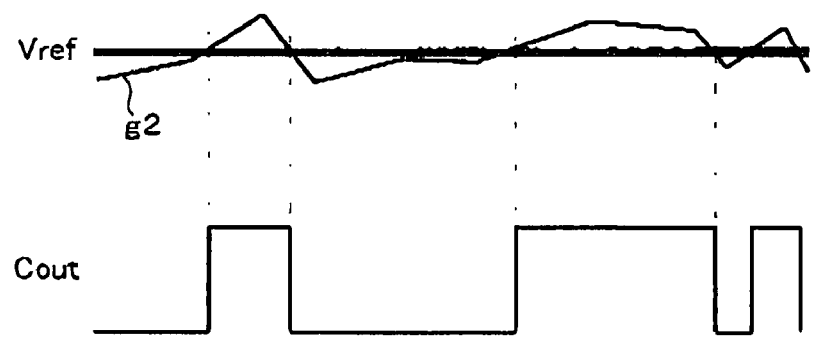
FIG. 39 is a waveform diagram explaining the manner how an output of the conventional sensor circuit becomes unstable.

Therefore, as shown in (a) of FIG. 33, the level shifter is provided with a reference voltage setting circuit 60 that selects $V_{ref\#H}$ when the output of the comparator 1 is HIGH, and selects $V_{ref\#L}$ when the output of the comparator 1 is LOW. By doing so, as shown in (b) of FIG. 33, the abrupt falling is obtained upon in the amplification on the lower voltage side while the abrupt rising is obtained in the amplification on the higher voltage side. Thus, the level shifter having an increased amplification speed can be realized.

INDUSTRIAL APPLICABILITY

The present invention is useful as a circuit device or electronic equipment in which the foregoing circuit device is used.

The invention claimed is:

1. A circuit device comprising:
   a comparator configured to compare an input voltage with a reference voltage selected from a reference voltage set including a plurality of voltage values that are different from one another:
   a reference voltage setting circuit configured to,
      select a voltage value lower than the reference voltage from the reference voltage set when it is detected that the input voltage in a rising transition reaches the reference voltage,
      select a voltage value higher than the reference voltage from the reference voltage set when it is detected that the input voltage in a falling transition reaches the reference voltage, and
      set the selected voltage value as the reference voltage of the comparator.

2. The circuit device according to claim 1, further comprising:
   a S/N ratio determining circuit for determining a S/N ratio of the input voltage, wherein
   the reference voltage setting circuit sets one reference voltage value included in the reference voltage set as an initial value of the reference voltage of the comparator, and
   the reference voltage setting circuit selects a voltage value in accordance with the S/N ratio determined by the S/N ratio determining circuit, from voltage values in the reference voltage set that are lower than the reference voltage, and sets the selected voltage value as the reference voltage of the comparator when the input voltage, detected to be in a rising transition, reaches the reference voltage.

3. The circuit device according to claim 1, further comprising:
   a S/N ratio determining circuit configured to determine a S/N ratio of the input voltage, wherein
   the reference voltage setting circuit sets one reference voltage value in the reference voltage set as an initial value of the reference voltage of the comparator, and
   the reference voltage setting circuit selects a voltage value in accordance with the S/N ratio determined by the S/N ratio determining circuit, from voltage values in the reference voltage set that are higher than the reference voltage, and sets the selected voltage value as the reference voltage of the comparator when the input voltage, detected to be in a falling transition, reaches the reference voltage.

4. The circuit device according to claim 1, further comprising:
   a selection signal generating circuit configured to receive a reference voltage designation input that designates one reference voltage value in the reference voltage set, and generating a selection signal for the reference voltage, wherein
   the reference voltage setting circuit selects a pair of reference voltage values in the reference voltage set according to the selection signal fed from the selection signal generating circuit,
   the reference voltage setting circuit sets the lower one of the pair of the reference voltage values as the reference voltage of the comparator when the input voltage, determined to be in a rising transition, reaches the higher one of the pair of the reference voltage values, and
   the reference voltage setting circuit sets the higher one of the pair of the reference voltage values as the reference voltage of the comparator when the input voltage, determined to be in a falling transition, reaches the lower one of the pair of the reference voltage values.

5. The circuit device according to claim 1, further comprising:
   a selection signal generating circuit configured to receive a reference voltage designation input that designates one reference voltage value in the reference voltage set, and generating a selection signal for the reference voltage; and
   a S/N ratio determining circuit configured to determine a an S/N ratio of the input voltage, wherein
   the reference voltage setting circuit selects one reference voltage value in the reference voltage set according to the selection signal fed from the selection signal generation circuit, and sets the selected value as an initial value of the reference voltage of the comparator, and
   the reference voltage setting circuit selects a voltage value in accordance with the S/N ratio determined by the S/N ratio determining circuit, from voltage values in the reference voltage set that are lower than the initial value of the reference voltage when the input voltage, determined to be in a rising transition, reaches the reference voltage, and sets the selected voltage value as the reference voltage of the comparator.

6. The circuit device according to claim 1, further comprising:
   a selection signal generating circuit for receiving a reference voltage designation input that designates one reference voltage value in the reference voltage set, and generating a selection signal for the reference voltage; and
   a S/N ratio determining circuit configured to determine a S/N ratio of the input voltage, wherein
   the reference voltage setting circuit selects one reference voltage value in the reference voltage set according to the selection signal fed from the selection signal generation circuit, and sets the selected value as an initial value of the reference voltage of the comparator, and
   the reference voltage setting circuit selects a voltage value in accordance with the S/N ratio determined by the S/N ratio determining circuit, from voltage values in the reference voltage set that are higher than the initial value of the reference voltage when the input voltage, determined to be in a falling transition, reaches the reference voltage, and sets the selected voltage value as the reference voltage of the comparator.

7. The circuit device according to claim 1, comprising:
a plurality of sets of the comparator; and
a plurality of sets of the reference voltage setting circuit, wherein voltage values in a reference voltage set of each reference voltage setting circuit are set so that voltage values for one reference voltage setting circuit do not to overlap voltage values for another reference voltage setting circuit.

8. The circuit device according to claim 1, further comprising:
a latch circuit on a stage following the comparator, wherein the reference voltage setting circuit selects a voltage value to be set as the reference voltage of the comparator, based on at least one of an output of the comparator and an output of the latch circuit.

9. The circuit device according to claim 8, comprising:
a plurality of sets of the comparator;
a plurality of sets of the reference voltage setting circuit; and
a plurality of sets of the latch circuit, wherein voltage values in a reference voltage set of each reference voltage setting circuit are set so that voltage values for one reference voltage setting circuit do not to overlap voltage values for another reference voltage setting circuit.

10. The circuit device according to claim 1, wherein
a voltage value lower than the reference voltage is selected from the reference voltage set, and the selected voltage value is set as the reference voltage of the comparator when a sampling operation and a comparing operation are performed with respect to the input voltage a plurality of times sequentially, when the input voltage compared with the reference voltage by the comparator has a value higher than that in a previous comparing operation and reaches the reference voltage of the comparator while exhibiting a rising transition during a current sampling period.

11. The circuit device according to claim 7, wherein
a voltage value lower than the reference voltage is selected from the reference voltage set, and the selected voltage value is set as the reference voltage of the first comparator when a sampling operation and a comparing operation are performed with respect to the input voltage a plurality of times sequentially, when the input voltage compared with the reference voltage by the comparator as a first comparator has a value lower than that in a previous comparing operation and reaches the reference voltage of the first comparator while exhibiting a rising transition during a current sampling period, and
in the case where the setting of the reference voltage with respect to the second comparator is brought back to a previous setting when, in a previous comparing operation, the setting of a reference voltage was carried out with respect to a second comparator different from the first comparator.

12. The circuit device according to claim 7, wherein
a voltage value lower than the reference voltage is selected from the reference voltage set, and the selected value is set as the reference voltage of the first comparator when a sampling operation and a comparing operation are performed with respect to the input voltage a plurality of times sequentially, when the input voltage compared with the reference voltage by the comparator as a first comparator has a value higher than that in a previous comparing operation and reaches the reference voltage of the first comparator while exhibiting a rising transition during a current sampling period, and
the setting of the reference voltage with respect to the second comparator is brought back to a previous setting when, in a previous comparing operation, the setting of a reference voltage was carried out with respect to a second comparator different from the first comparator.

13. The circuit device according to claim 1, wherein
a voltage value higher than the reference voltage is selected from the reference voltage set, and the selected voltage is set as the reference voltage of the comparator when a sampling operation and a comparing operation are performed with respect to the input voltage a plurality of times sequentially, when the input voltage compared with the reference voltage by the comparator has a value lower than that in a previous comparing operation and reaches the reference voltage of the comparator while exhibiting a falling transition during a current sampling period.

14. The circuit device according to claim 7, wherein
a voltage value higher than the reference voltage is selected from the reference voltage set, and the selected voltage value is set as the reference voltage of the first comparator when a sampling operation and a comparing operation are performed with respect to the input voltage a plurality of times sequentially, when the input voltage compared with the reference voltage by the comparator as a first comparator has a value higher than that in a previous comparing operation and reaches the reference voltage of the first comparator while exhibiting a falling transition during a current sampling period, and
the setting of the reference voltage with respect to the second comparator is brought back to a previous setting when, in a previous comparing operation, the setting of a reference voltage was carried out with respect to a second comparator different from the first comparator.

15. The circuit device according to claim 7, wherein
a voltage value higher than the reference voltage is selected from the reference voltage set, and the selected voltage value is set as the reference voltage of the first comparator when a sampling operation and a comparing operation are performed with respect to the input voltage a plurality of times sequentially, when the input voltage compared with the reference voltage by the comparator as a first comparator has a value lower than that in a previous comparing operation and reaches the reference voltage of the first comparator while exhibiting a falling transition during a current sampling period, and
the setting of the reference voltage with respect to the second comparator is brought back to a previous setting when, in a previous comparing operation, the setting of a reference voltage was carried out with respect to a second comparator different from the first comparator.

16. Electronic equipment comprising:
a sensor element; and the circuit device according to claim 1, wherein the input voltage of the circuit device is an output of the sensor element.

17. The electronic equipment according to claim 16, wherein
the sensor element is a light sensor,
the electronic equipment further includes,
a liquid crystal module,
a backlight stacked on the liquid crystal module, and
an adjusting means for adjusting brightness of the backlight according to an output of the circuit device.

18. A circuit device comprising:
a comparator configured to compare an input voltage with a reference voltage selected from a reference voltage set including a plurality of voltage values that are different from one another, and to amplify the input voltage based on a result of the comparison;
a reference voltage setting circuit configured to,
selects a first voltage value lower than the reference voltage from the reference voltage set when amplifying the input voltage in a voltage increasing direction,
selects a second voltage value higher than the reference voltage from the reference voltage set when amplifying the input voltage in a voltage decreasing direction, and
set the selected voltage value as the reference voltage of the comparator.

* * * * *